(12) United States Patent
Asaoka et al.

(10) Patent No.: US 9,368,211 B2
(45) Date of Patent: *Jun. 14, 2016

(54) SEMICONDUCTOR MEMORY DEVICE HAVING A MEMORY STRING THAT INCLUDES A TRANSISTOR HAVING A CHARGE STORED THEREIN TO INDICATE THE MEMORY STRING IS DEFECTIVE

(71) Applicant: KABUSHIKI KAISHA TOSHIBA, Tokyo (JP)

(72) Inventors: Norichika Asaoka, Kanagawa (JP); Masanobu Shirakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/596,639

(22) Filed: Jan. 14, 2015

(65) Prior Publication Data

US 2015/0124528 A1 May 7, 2015

Related U.S. Application Data

(63) Continuation of application No. 13/782,847, filed on Mar. 1, 2013, now Pat. No. 8,958,247.

(30) Foreign Application Priority Data

Sep. 21, 2012 (JP) ................................. 2012-208786

(51) Int. Cl.
*G11C 16/04* (2006.01)
*G11C 16/06* (2006.01)
(Continued)

(52) U.S. Cl.
CPC ............ *G11C 16/06* (2013.01); *G11C 11/5621* (2013.01); *G11C 16/04* (2013.01);
(Continued)

(58) Field of Classification Search
CPC .... G11C 16/06; G11C 16/0483; G11C 16/16; G11C 16/04; G11C 16/3445; G11C 29/04; G11C 16/08; G11C 16/10
USPC .............. 365/185.11, 185.17, 185.18, 185.29
See application file for complete search history.

(56) References Cited

U.S. PATENT DOCUMENTS

| 5,539,690 A | 7/1996 | Talreja et al. |
| 5,596,526 A | 1/1997 | Assar et al. |

(Continued)

FOREIGN PATENT DOCUMENTS

| JP | 2000163976 A | 6/2000 |
| JP | 2001273798 A | 10/2001 |

(Continued)

OTHER PUBLICATIONS

Japanese Office Action dated Jan. 20, 2015, filed in Japanese counterpart Application No. 2012-208786, 12 pages (with translation).

(Continued)

*Primary Examiner* — Gene Auduong
(74) *Attorney, Agent, or Firm* — Patterson & Sheridan, LLP

(57) ABSTRACT

A semiconductor memory device includes a memory string having first and second selective transistors, each of which includes a charge storage layer and a control gate, a back gate transistor which includes a charge storage layer and a control gate, and memory cell transistors connected to each other and to the back gate transistor in series between the first and second selective transistors. In case any of the memory cell transistors is defective, the defect is indicated by storing a charge in the charge storage layer of at least one of the first and second selective transistors and the back gate transistor.

12 Claims, 31 Drawing Sheets

(51) Int. Cl.
*G11C 16/10* (2006.01)
*G11C 11/56* (2006.01)
*G11C 16/16* (2006.01)
*G11C 16/34* (2006.01)
*G11C 29/04* (2006.01)
*G11C 29/44* (2006.01)
*G11C 29/00* (2006.01)
*G11C 16/08* (2006.01)

(52) U.S. Cl.
CPC ............ *G11C16/0483* (2013.01); *G11C 16/10* (2013.01); *G11C 16/16* (2013.01); *G11C 16/3445* (2013.01); *G11C 29/04* (2013.01); *G11C 29/44* (2013.01); *G11C 29/789* (2013.01); *G11C 16/08* (2013.01); *G11C 29/785* (2013.01); *G11C 29/832* (2013.01)

(56) References Cited

U.S. PATENT DOCUMENTS

| | | | |
|---|---|---|---|
| 5,757,699 | A | 5/1998 | Takeshima et al. |
| 5,892,710 | A | 4/1999 | Fazio et al. |
| 5,898,615 | A | 4/1999 | Chida |
| 6,028,792 | A | 2/2000 | Tanaka et al. |
| 6,507,518 | B2 | 1/2003 | Hosono et al. |
| 7,073,103 | B2 | 7/2006 | Gongwer et al. |
| 7,643,346 | B2 | 1/2010 | Toriyama et al. |
| 7,884,417 | B2 | 2/2011 | Mizukami et al. |
| 7,936,004 | B2 | 5/2011 | Kito et al. |
| 7,948,804 | B2 | 5/2011 | Komatsu |
| 8,223,587 | B2 | 7/2012 | Krebs et al. |
| 8,315,097 | B2 | 11/2012 | Hishida et al. |
| 8,767,466 | B2 | 7/2014 | Asaoka et al. |
| 2002/0051385 | A1 | 5/2002 | Hosono et al. |
| 2004/0156239 | A1 | 8/2004 | Funaki |
| 2005/0056869 | A1 | 3/2005 | Ichige et al. |
| 2006/0118861 | A1 | 6/2006 | Van Schaijk et al. |
| 2006/0221730 | A1 | 10/2006 | Park |
| 2006/0227624 | A1 | 10/2006 | Shiga |
| 2007/0147121 | A1 | 6/2007 | Futatsuyama |
| 2007/0147144 | A1 | 6/2007 | Tokiwa |
| 2007/0234144 | A1 | 10/2007 | Gongwer et al. |
| 2007/0297236 | A1 | 12/2007 | Tokiwa |
| 2008/0005530 | A1 | 1/2008 | Nakano |
| 2008/0198659 | A1 | 8/2008 | Honma et al. |
| 2010/0085820 | A1 | 4/2010 | Nagashima |
| 2010/0195411 | A1 | 8/2010 | Abiko |
| 2011/0103149 | A1 | 5/2011 | Katsumata et al. |
| 2012/0026775 | A1 | 2/2012 | Yamada et al. |
| 2012/0134210 | A1 | 5/2012 | Maeda |
| 2012/0182803 | A1 | 7/2012 | Shirakawa |
| 2014/0085982 | A1* | 3/2014 | Asaoka ............... G11C 16/06 365/185.17 |

FOREIGN PATENT DOCUMENTS

| | | |
|---|---|---|
| JP | 2002133894 A | 5/2002 |
| JP | 2005071558 A | 3/2005 |
| JP | 2005116119 A | 4/2005 |
| JP | 2007066386 A | 3/2007 |
| JP | 2012033216 A | 2/2012 |
| WO | 2007076512 A2 | 7/2007 |
| WO | 2007126665 A1 | 11/2007 |
| WO | 2008103586 A1 | 8/2008 |

OTHER PUBLICATIONS

Taiwan Office Action dated Aug. 18, 2015, filed in Taiwan counterpart Application No. 102126738, 8 pages (with translation).

* cited by examiner

*Fig. 22*
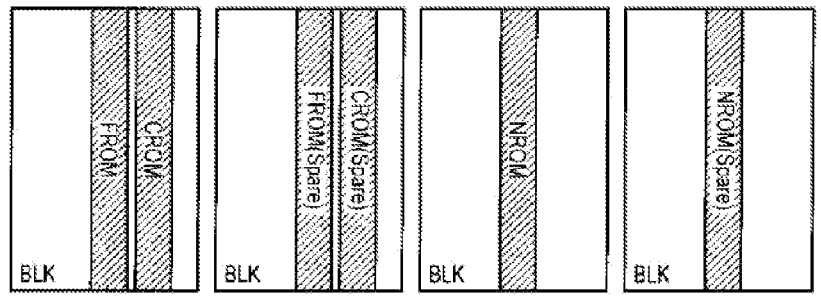
*Fig. 23*
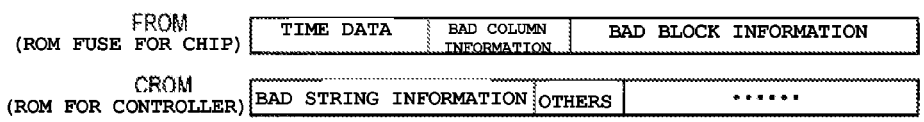
*Fig. 24*
| Valid | Block Address | String Address |
|---|---|---|
| "1" | BLK0 | String1 |
|  | BLK0 | String5 |
|  | BLK5 | String10 |
|  | ⋮ | ⋮ |
*Fig. 25*
| Valid | Block Address | String0 | String1 | String2 | String3 | String4 | String5 | String6 | String7 |
|---|---|---|---|---|---|---|---|---|---|
| "1" | BLK0 | 0 | 0 | 0 | 1 | 0 | 0 | 0 | 1 |
|  | BLK2 | 0 | 1 | 0 | 1 | 0 | 1 | 0 | 0 |
|  | BLK10 | 1 | 0 | 0 | 0 | 0 | 0 | 0 | 0 |
|  | ⋮ | ⋮ | ⋮ | ⋮ | ⋮ | ⋮ | ⋮ | ⋮ | ⋮ |

SEMICONDUCTOR MEMORY DEVICE HAVING A MEMORY STRING THAT INCLUDES A TRANSISTOR HAVING A CHARGE STORED THEREIN TO INDICATE THE MEMORY STRING IS DEFECTIVE

CROSS-REFERENCE TO RELATED APPLICATION

This application is a continuation of U.S. patent application Ser. No. 13/782,847, filed on Mar. 1, 2013, which is based upon and claims the benefit of priority from Japanese Patent Application No. 2012-208786, filed Sep. 21, 2012, the entire contents of each of which are incorporated herein by reference.

FIELD

Embodiments described herein relate to a semiconductor memory device.

BACKGROUND

NAND-type flash memories in which memory cells are three-dimensionally arranged are known.

DESCRIPTION OF THE DRAWINGS

FIG. 22 is a schematic diagram showing a memory cell array of a third embodiment.

FIG. 23 is a conceptual diagram showing a ROM fuse data of the third embodiment.

FIG. 24 is a conceptual diagram showing bad string information of the third embodiment.

FIG. 25 is a conceptual diagram showing the bad string information of the third embodiment.

DETAILED DESCRIPTION

Embodiments provide a semiconductor memory device that stores bad string information so that utilization efficiency can be improved.

In general, the embodiments will be explained with reference to the figures. In the following explanation, the same reference symbols are given to the same parts across all of the figures.

A semiconductor memory device according to an embodiment includes a memory string having first and second selective transistors, each of which includes a charge storage layer and a control gate, a back gate transistor which includes a charge storage layer and a control gate, and memory cell transistors connected to each other and to the back gate transistor in series between the first and second selective transistors. In case any of the memory cell transistors is defective, the defect is indicated by storing a charge in the charge storage layer of at least one of the first and second selective transistors and the back gate transistor.

1. First Embodiment

The semiconductor memory device of the first embodiment will be explained. In the following, as an example of the semiconductor memory device, a three-dimensional, layered NAND-type flash memory in which memory cells are layered on a semiconductor substrate will be explained.

1.1 Constitution of Semiconductor Memory Device

First, the constitution of the semiconductor memory device of this embodiment will be explained.

1.1.1 Entire Constitution of Semiconductor Memory Device

Figure 1:
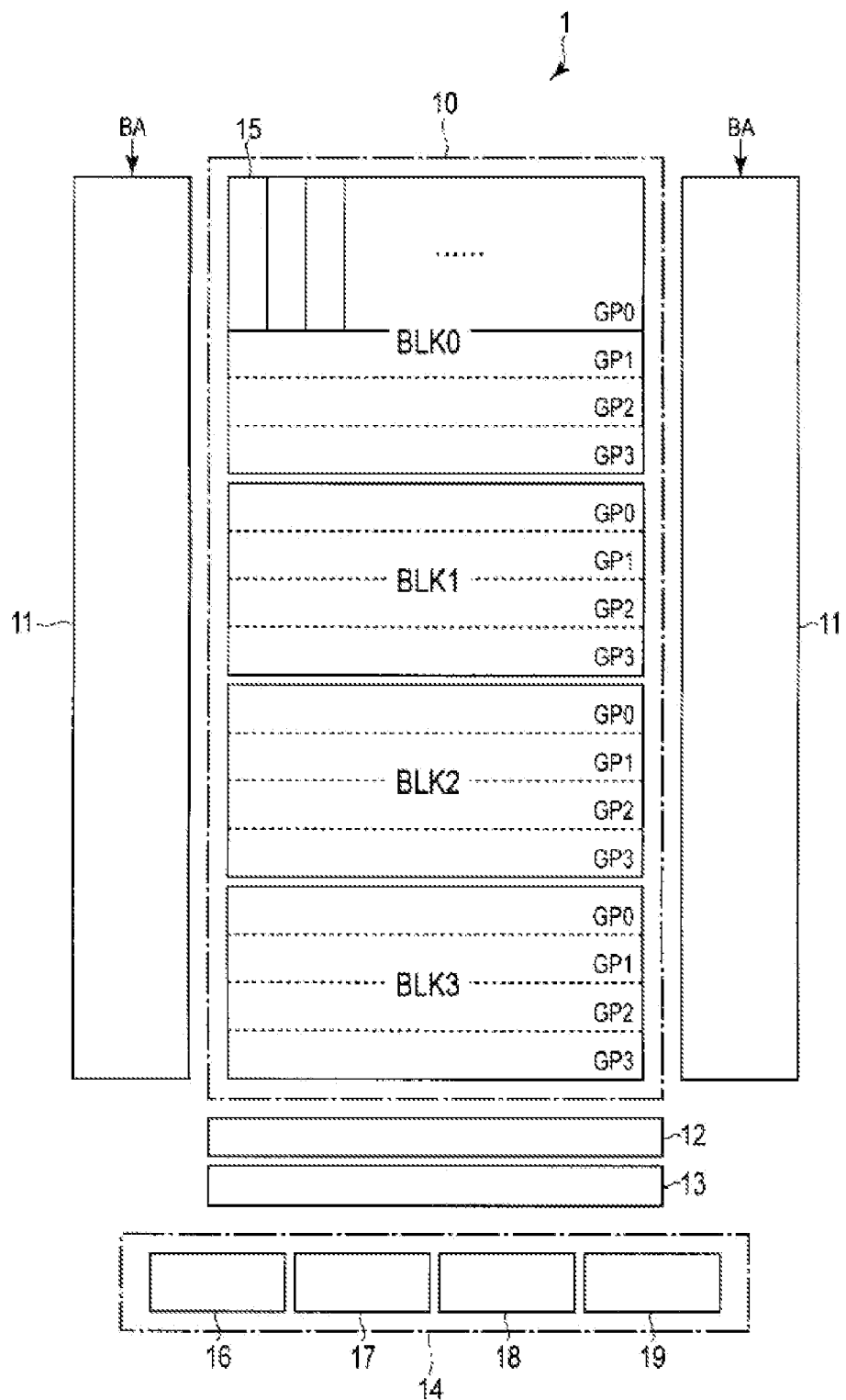
FIG. 1 is a block diagram showing the semiconductor memory device of a first embodiment.

FIG. 1 is a block diagram showing the semiconductor memory device of this embodiment. As shown in the figure, a NAND-type flash memory 1 is provided with memory cell array 10, row decoder 11, sense amplifier 12, column decoder 13, and peripheral circuit 14.

The memory cell array 10 includes several (4 pieces in this example) blocks BLK (BLK0 to BLK3) as a set of nonvolatile memory cells. Data in the same block BLK are collectively erased. Each of the blocks BLK includes several (4 pieces in this example) string groups GP (GP0 to GP3) as a set of NAND strings 15 in which memory cells are connected in series. The number of blocks in the memory cell array 10 or the number of string groups in one block BLK is arbitrary.

The row decoder 11 decodes a block address BA and selects the corresponding block BLK.

When data are read out, the sense amplifier 12 senses and amplifies the data read out of the memory cells. In addition, when data are written, the sense amplifier transfers the write data to the memory cells.

The column decoder 13 decodes a column address and selects the column direction of the memory cell array 10.

The peripheral circuit 14 is provided with first driver 16, second driver 17, charge pump 18, and address decoder 19.

The first driver 16 supplies a voltage required for the write, readout, and erase of data to the row decoder 11. This voltage is applied to the memory cells (word lines, selective gate lines, and back gate lines that will be described later) by the row decoder 11.

The second driver 17 supplies a voltage required for the write, readout, and erase of data to the sense amplifier 12 and a source line driver not shown in the figure. This voltage is applied to the memory cells (bit lines and the source line that will be described later) by the sense amplifier 12 and the source line driver.

The charge pump 18 steps up a power supply voltage, which is applied from the outside, and supplies a required voltage to the first driver 16 and the second driver 17.

The address decoder 19 receives an address from a controller for controlling the NAND-type flash memory 1. Next, the address decoder decodes this address, transmits a block address to the row decoder 11, transmits a column address to the column decoder 13, and transmits a page address to the first driver 16.

A sequencer (shown in FIG. 41 as SEQ) controls the entire operation of the NAND-type flash memory 1.

1.1.2 Memory Cell Array 10

Figure 2:
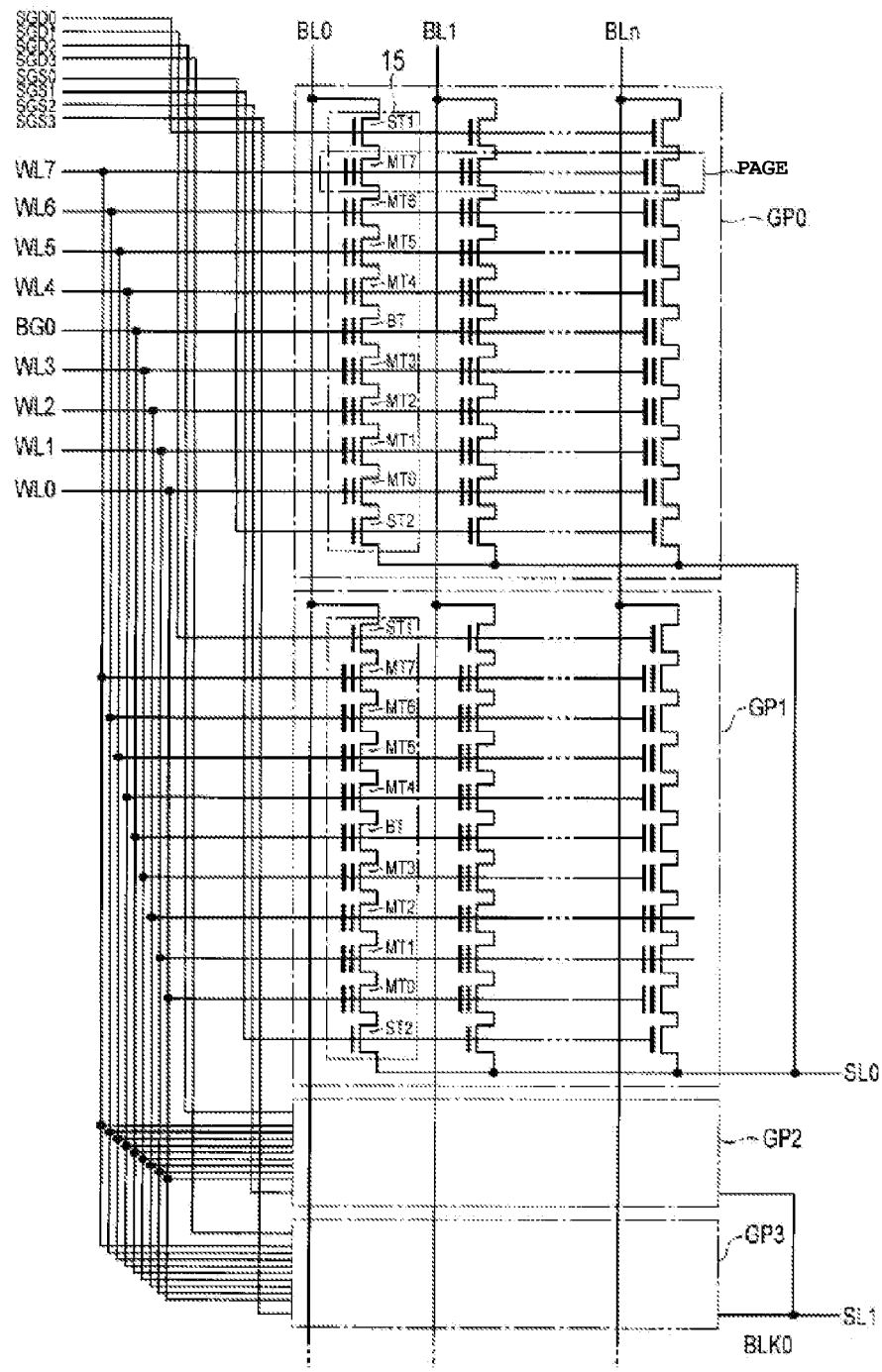
FIG. 2 is a circuit diagram showing a memory cell array of the first embodiment.

Next, details of the constitution of the memory cell array 10 will be explained. FIG. 2 is a circuit diagram showing the block BLK0. The blocks BLK1 to BLK3 have a similar constitution to block BLK0.

As shown in the figure, the block BLK0, for example, includes four string groups GP. In addition, each string group GP includes n pieces (n represents a natural number) of NAND strings 15.

Each of the NAND strings 15, for example, includes 8 memory cell transistors MT (MT0 to MT7), selective transistors ST1 and ST2, and a back gate transistor BT. The memory cell transistors MT are provided with a layered gate including a control gate and a charge storage layer and holds data in a nonvolatile fashion. Here, the number of memory cell transistors MT is not limited 8 but may be 16, 32, 64, 128, and the like. The back gate transistor BT, similar to the memory cell transistor MT, is provided with a layered gate including a control gate and a charge storage layer. However, the back gate transistor BT does not hold data but functions as a simple current path when data are written, read out, and erased. The memory cell transistors MT and the back gate transistor BT are arranged between the selective transistors ST1 and ST2 so that their current paths are connected in series. Here, the back gate transistor BT is installed between the memory cell transistors MT3 and MT4. The current path of the memory cell transistor MT7 at one end of the series connection is connected to one end of the current path of the selective transistor ST1, and the current path of the memory cell transistor MT0 at the other end is connected to one end of the current path of the selective transistor ST2.

The gate of the selective transistor ST1 of each of the string groups GP0 to GP3 is commonly connected to selective gate lines SGD0 to SGD3, respectively; additionally, the gate of the selective transistor ST2 is commonly connected to the selective gate lines SGS0 to SGS3. On the contrary, the control gates of the memory cell transistors MT0 to MT7 in the same block BLK0 are commonly connected to word lines WL0 to WL7, respectively; additionally, the control gate of the back gate transistor BT is commonly connected to the back gate line BG (respectively BG0 to BG3 in the blocks BLK0 to BLK3).

In other words, the word lines WL0 to WL7 and the back gate line BG are commonly connected among several string groups GP0 to GP3 in the same block BLK0, whereas the selective gate lines SGD and SGS are independent for each string group GP0 to GP3, even in the same block BLK0.

In addition, of the NAND strings 15 arranged in a matrix form in the memory cell array 10, the other ends of the current paths of the selective transistors ST1 of the NAND strings 15 in the same row is commonly connected to any of the bit lines BL (BL0 to BLn, where n represents a natural number). In other words, the bit lines BL commonly connect the NAND strings 15 among several blocks BLK. Moreover, the other end of the current path of the selective transistor ST2 is commonly connected to the source line SL. The source line SL, for example, commonly connects the NAND strings 15 among several blocks.

As previously mentioned, data of the memory cell transistors MT in the same block BLK are collectively erased. On the contrary, data are collectively read out and written for several memory cell strings MT commonly connected to any of the word lines WL in any of the string groups GP of any of the blocks BLK. This unit is called a "page."

Figure 3:
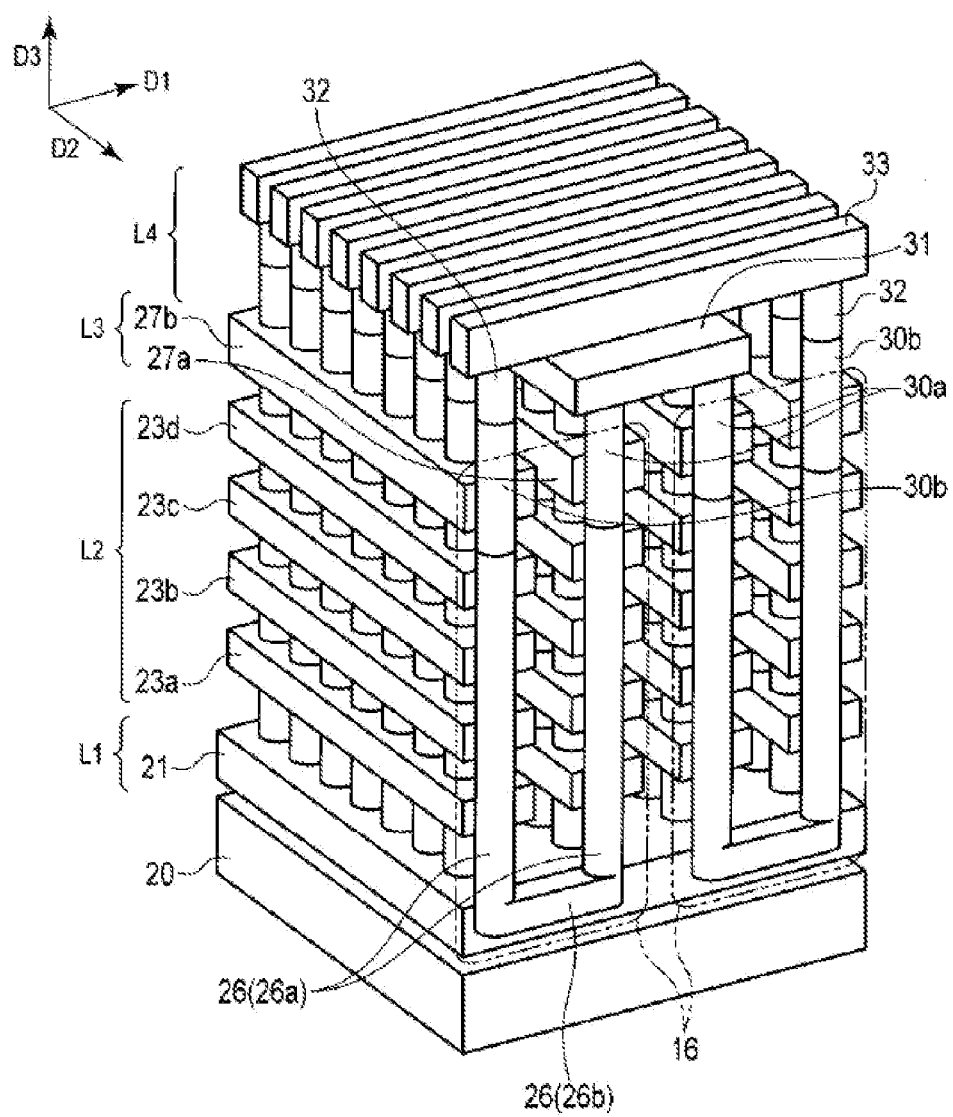
FIG. 3 is a perspective view showing the memory cell array of the first embodiment.
Figure 4:
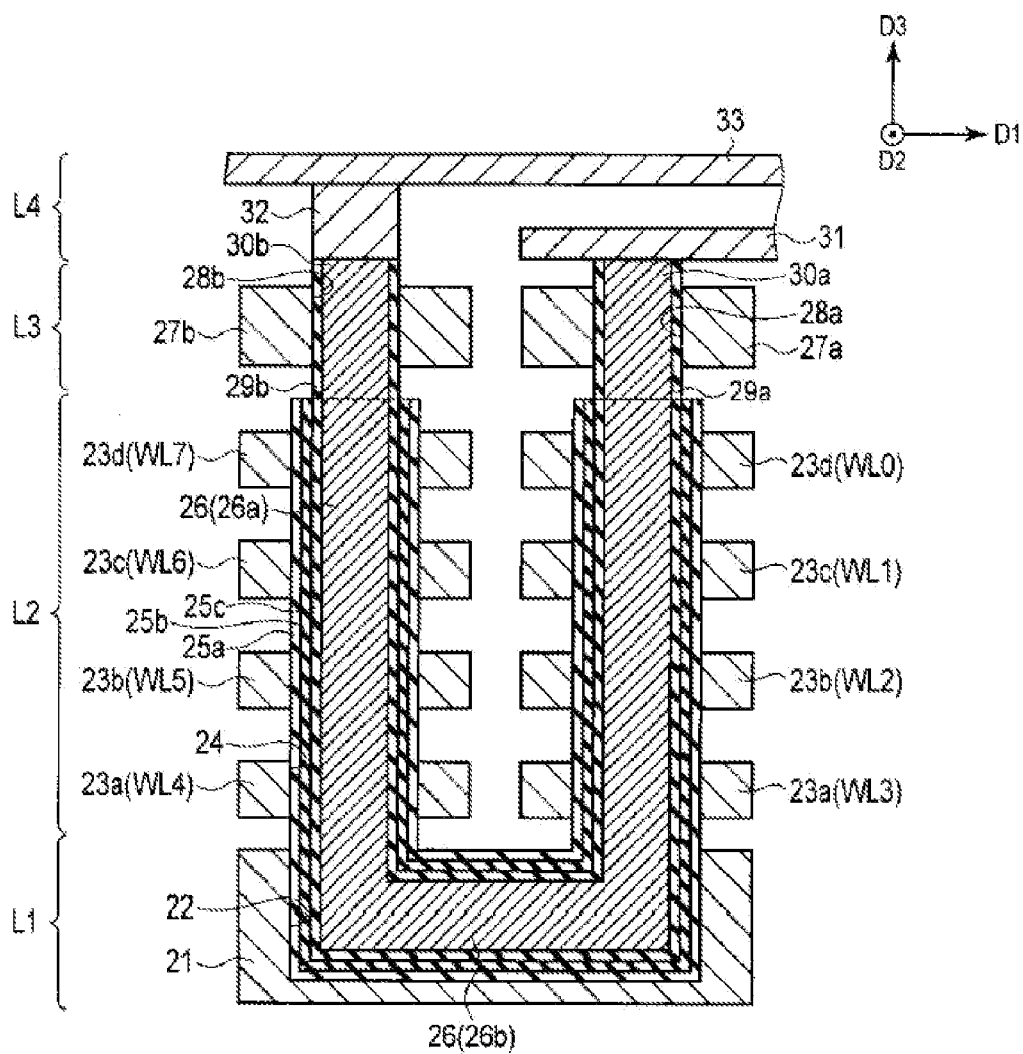
FIG. 4 is a cross section showing the memory cell array of the first embodiment.

Next, the three-dimensional layered structure of the memory cell array 10 will be explained with reference to FIG. 3 and FIG. 4. FIG. 3 and FIG. 4 are a perspective view and across section showing the memory cell array 10, respectively.

As shown in the figures, the memory 10 is installed on a semiconductor substrate 20. In addition, the memory cell array 10 has back gate transistor layer L1, memory cell transistor layer L2, selective transistor layer L3, and wiring layer L4 sequentially formed above the semiconductor substrate 20.

The back gate transistor layer L1 functions as the back gate transistor BT. The memory cell transistor layer L2 functions as the memory cell transistors MT0 to MT7 (NAND strings 15). The selective transistor layer L3 functions as the selective transistors ST1 and ST2. The wiring layer L4 functions as the source line SL and the bit lines BL.

The back gate transistor layer L1 has a back gate conductive layer 21. The back gate conductive layer 21 is formed so that it is two-dimensionally extended in a first direction and a second direction parallel with the semiconductor substrate 20 (that is, the first direction and the second direction are orthogonal to the third direction in which the memory cells are layered). The back gate conductive layer 21 is divided for each block BLK. The back gate conductive layer 21, for example, is formed of polysilicon layer. The back gate conductive layer 21 functions as the back gate line BG.

In addition, the back gate conductive layer 21, as shown in FIG. 4, has a back gate hole 22. The back gate hole 22 is formed so that the back gate conductive layer 21 is dug into it. The back gate hole 22 is formed in an approximate rectangular shape in which the first direction is a longitudinal direction from a top view.

The memory transistor layer L2 is formed above the back gate conductive layer L1. The memory transistor layer L2 has word line conductive layers 23a to 23d. The word line conductive layers 23a to 23d are layered via an interlayer dielectric (not shown in the figure). The word line conductive layers 23a to 23d are formed in a stripe shape that has a prescribed pitch in the first direction and extends in the second direction. The word line conductive layers 23a to 23d, for example, are composed of polysilicon. The word line conductive layer 23a functions as the control gate (word lines WL3 and WL4) of the memory cell transistors MT3 and MT4; the word line conductive layer 23b functions as the control gate (word lines WL2 and WL5) of the memory cell transistors MT2 and MT5; the word line conductive layer 23c functions as the control gate (word lines WL1 and WL6) of the memory cell transistors MT1 and MT6; and the word line conductive layer 23d functions as the control gate (word lines WL0 and WL7) of the memory cell transistors MT0 and MT7.

Moreover, the memory transistor layer L2, as shown in FIG. 4, has a memory hole 24. The memory hole 24 is formed so that it penetrates the word line conductive layers 23a to 23d. The memory hole 24 is formed so that it is matched with the end vicinity in the first direction of the back gate hole 22.

Furthermore, the back gate transistor layer L1 and the memory transistor layer L2, as shown in FIG. 4, have block insulating layer 25a, charge storage layer 25b, tunnel insulating layer 25c, and semiconductor layer 26. The semiconductor layer 26 functions as the body of the NAND string 15 (the back gate of each transistor).

The block insulating layer 25a, as shown in FIG. 4, is formed at a prescribed thickness at the side wall facing the back gate hole 22 and the memory hole 25. The charge storage layer 25b is formed at a prescribed thickness on the side surface of the block insulating layer 25a. The tunnel insulating layer 25c is formed at a prescribed thickness on the side surface of the charge storage layer 25b. The semiconductor layer 26 is formed in contact with the side surface of the tunnel insulating layer 25c. The semiconductor layer 26 is formed so that the back gate hole 22 and the memory hole 24 are embedded into it.

The semiconductor layer 26 is formed in a U shape from the second direction. In other words, the semiconductor layer 26 has a pair of columnar parts 26a extending in the direction perpendicular to the surface of the semiconductor substrate 20 and a connecting part 26b for connecting the lower end of a pair of columnar parts 26a.

The block insulating layer 25a and the tunnel insulating layer 25c, for example, are formed of a silicon oxide ($SiO_2$). The charge storage layer 25b, for example, is formed of a silicon nitride (SiN). The semiconductor layer 26 is formed of polycrystalline silicon. The block insulating layer 25a, charge storage layer 25b, tunnel insulating layer 25c, and semiconductor layer 26 form MONOS-type transistors functioning as the memory transistor MT.

In the back gate transistor layer L1, the tunnel insulating layer 25c is formed so that it encloses the connecting part 26b. The back gate conductive layer 21 is formed so that it encloses the connecting part 26b.

In addition, in the memory transistor layer L2, the tunnel insulating layer 25c is formed so that it encloses the columnar parts 26a. The charge storage layer 25b is formed so that it encloses the tunnel insulating layer 25c. The block insulating layer 25a is formed so that it encloses the charge storage layer 25b. The word line conductive layers 23a to 23d are formed so that they enclose the block insulating layers 25a to 25c and the columnar parts 26a.

The selective transistor layer L3, as shown in FIG. 3 and FIG. 4, has conductive layers 27a and 27b. The conductive layers 27a and 27b are formed in a stripe shape that has a prescribed pitch in the first direction and extends in the second direction. A pair of conductive layers 27a and a pair of conductive layers 27b are arranged in an alternate fashion in the first direction. The conductive layers 27a are formed in the upper layer of one columnar part 26a, and the conductive layers 27b are formed in the upper layer of the other columnar part 26a.

The conductive layers 27a and 27b are formed of polycrystalline silicon. The conductive layer 27a functions as the gate (selective gate line SGS) of the selective transistor ST2, and the conductive layer 27b functions as the gate (selective gate line SGD) of the selective transistor ST1.

The selective transistor layer L3, as shown in FIG. 4, has holes 28a and 28b. The holes 28a and 28b penetrate through the conductive layers 27a and 27b, respectively. In addition, the holes 28a and 28b are respectively matched with the memory hole 24.

The selective transistor layer L3, as shown in FIG. 4, is provided with gate insulating layers 29a and 29b and semiconductor layers 30a and 30b. The gate insulating layers 29a and 29b are respectively formed on the side wall facing the holes 28a and 28b. The semiconductor layers 30a and 30b are formed in a stripe shape extending in the direction perpendicular to the surface of the semiconductor substrate 20 so that they respectively contact with the gate insulating layers 29a and 29b.

The gate insulating layers 29a and 29b, for example, are formed of a silicon oxide ($SiO_2$). The semiconductor layers 30a and 30b, for example, are formed of polycrystalline silicon.

In the constitution of the selective transistor layer L3, the gate insulating layer 29a is formed so that it encloses the columnar semiconductor layer 30a. The conductive layer 27a is formed so that it encloses the gate insulating layer 29a and the semiconductor layer 30a. In addition, the gate insulating layer 29b is formed so that it encloses the columnar semiconductor layer 30b. The conductive layer 27b is formed so that it encloses the gate insulating layer 29b and the semiconductor layer 30b.

The wiring layer L4, as shown in FIG. 3 and FIG. 4, is formed above the selective transistor layer L3. The wiring layer L4 has source line layer 31, plug layer 32, and bit line layer 33.

The source line layer 31 is formed in a plate shape extending in the second direction. The source line layer 31 is formed in contact with the upper surfaces of a pair of semiconductor layers 27a adjacent to each other in the first direction. The plug layer 32 is formed so that it comes into contact with the upper surface of the semiconductor layers 27b and extends in the direction perpendicular to the surface of the semiconductor substrate 20. The bit line layer 33 is formed in a stripe shape that has a prescribed pitch in the second direction and extends in the first direction. The bit line layer 33 is formed so that it comes into contact with the upper surface of the plug layer 32. The source line layer 31, plug layer 32, and bit line layer 33, for example, are formed of a metal such as tungsten (W). The source line layer 31 functions as the source line SL, as shown in FIG. 1 and FIG. 2, and the bit line layer 33 functions as the bit lines BL.

1.1.3 Row Decoder 11

Figure 5:
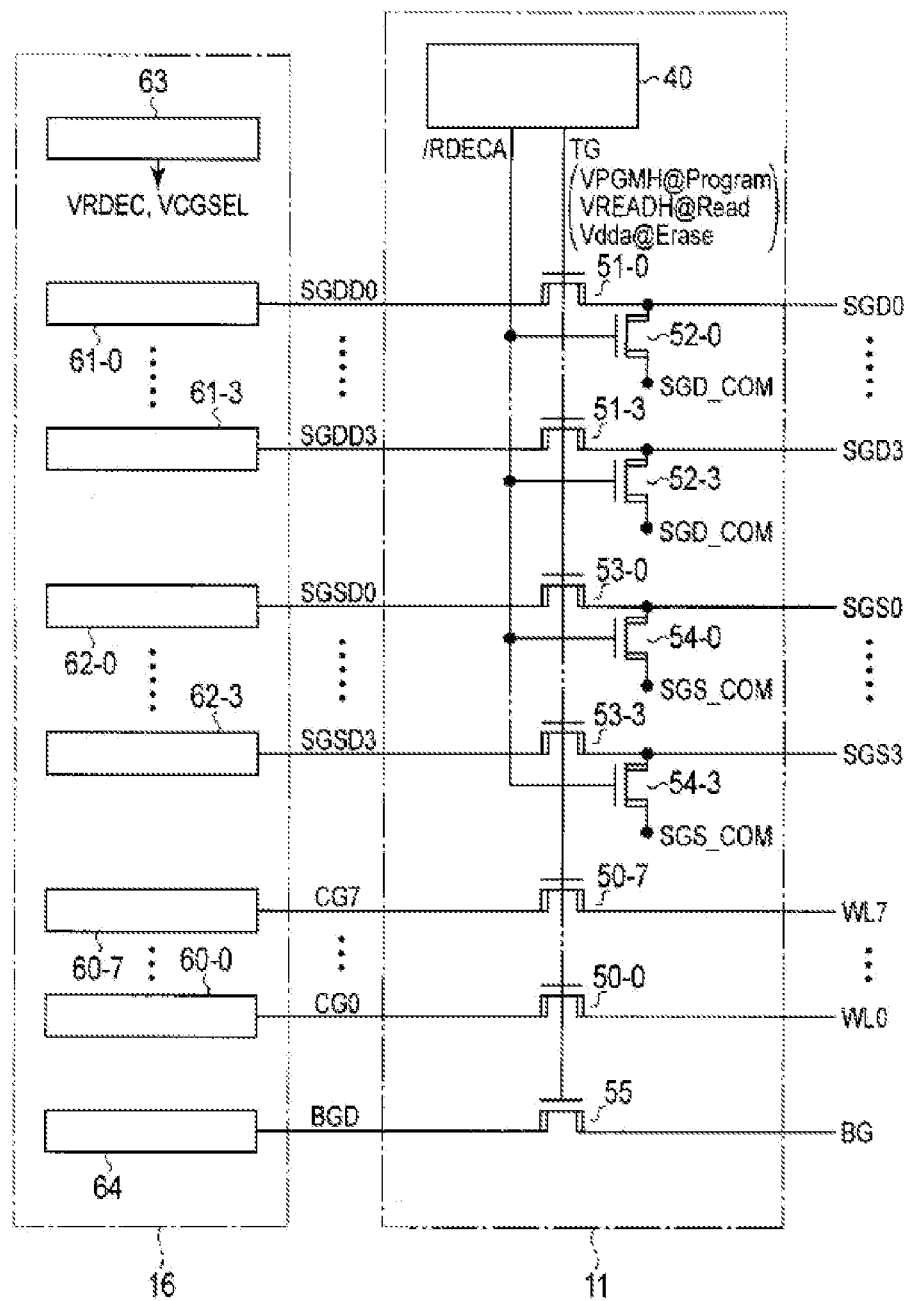
FIG. 5 is a block diagram showing a row decoder and a driver circuit of the first embodiment.

Next, the constitution of the row decoder 11 will be explained with referenced to FIG. 5. FIG. 5 is a block diagram showing the row decoder 11 and the first driver 16; for the row decoder 11, only the constitution related to any of the blocks BLK is shown. In other words, the row decoder 11 shown in FIG. 5 is installed for each block BLK. In addition, the row decoder 11 selects or does not select the related block BLK.

As shown in the figure, the row decoder 11 is provided with a block decoder 40 and high-breakdown voltage, enhancement-type (E-type) n-channel MOS transistors 50 to 54 (i.e., 50-0 to 50-7, 51-0 to 51-3, 52-0 to 52-3, 53-0 to 53-3, and 54-0 to 54-3) and 55.

<Block Decoder 40>

First, the block decoder 40 will be explained. The block decoder 40 decodes a block address BA and outputs signals TG and /RDECA when data are written, read out, and erased. In addition, when the block address BA is matched with the corresponding block BLK, the signal TG is set to "H" level. The voltage of the signal TG at "H" level is VPGMH at a time of writing, VREADH at a time of reading, and Vdda at a time of erasing. Moreover, the signal/RDECA is set to "L" level (for example, 0 V).

On the other hand, when the block address BA is not matched with the block BLK, the signal TG is turned to "L" level (for example, 0 V), and the signal/RDECA is turned to "H" level.

Here, the VPGMH is a voltage for transferring a high voltage VPGM, which is applied to a selective word line when data are written, and VPGMH>VPGM. The VREADH is a voltage for transferring a voltage VREAD, which is applied to nonselective word lines when data are read out, and VREADH>VREAD. The Vdda is a voltage for transferring a voltage Vdd (about 0.5 V), which is applied to word lines when data are erased, and Vdda>Vdd.

<Transistor 50>

Next, the transistor 50 will be explained. The transistor 50 transfers a voltage to the word lines WL of the selective blocks BLK. One end of each current path of the transistor 50-0 to 50-7 is respectively connected to the word lines WL0 to WL7 of the corresponding block BLK, the other end is respectively connected to signal lines CG0 to CG7 and its gate is commonly connected to the signal line TG.

For example, in the row decoder 11-0 corresponding to the selective block BLK0, the transistors 50-0 to 50-7 are turned on, connecting the word lines WL0 to WL7 to the signal lines CG0 to CG7. On the other hand, in the row decoders 11-1 to 11-3 corresponding to the nonselective blocks BLK1 to BLK3, the transistors 50-0 to 50-7 are turned off, separating the word lines WL0 to WL7 from the signal lines CG0 to CG7.

Here, the transistor 50 is commonly used in all of the string groups GP in the same block BLK.

<Transistors 51 and 52>

Next, the transistors 51 and 52 will be explained. The transistors 51 and 52 transfer a voltage to the selective gate lines SGD. One end of each current path of the transistors 51-0 to 51-3 is respectively connected to the selective gate lines SGD0 to SGD3 of the corresponding block BLK, and the other end is respectively connected to the signal lines SGDD0 to SGDD3 and its gate is commonly connected to the signal line TG. In addition, one end of each current path of the transistors 52-0 to 52-3 is respectively connected to the selective gate lines SGD0 to SGD3 of the corresponding block BLK0, and the other end is respectively connected to a node SGD_COM, the signal/RDECA being transmitted to its gate. The node SGD_COM is a voltage such as 0 V or negative voltage VBB for turning off the selective transistor ST1.

For example, in the row decoder 11-0 corresponding to the selective block BLK0, the transistors 51-0 to 51-3 are turned on, and the transistors 52-0 to 52-3 are turned off. As a result, the selective gate lines SGD0 to SGD3 of the selective block BLK0 are connected the signal lines SGDD0 to SGDD3.

On the other hand, in the row decoders 11-1 to 11-3 corresponding to the nonselective blocks BLK1 to BLK3, the transistors 51-0 to 51-3 are turned off, and the transistors 52-0 to 52-3 are turned on. Therefore, the selective gate lines SGD0 to SGD3 of the nonselective blocks BLK1 to BLK3 are connected to the node SGD_COM.

<Transistors 53 and 54>

The transistors 53 and 54 transfer a voltage to the selective gate lines SGS. Their connection and operation are equivalent to the replacement of the selective gate lines SGD in the transistors 51 and 52 with the selective gate lines SGS.

In other words, in the row decoder 11-0 corresponding to the selective block BLK0, the transistors 53-0 to 53-3 are turned on, and the transistors 54-0 to 54-4 are turned off. On the other hand, in the row decoders 11-1 to 11-3 corresponding to the nonselective blocks BLK1 to BLK3, the transistors 51-0 to 51-3 are turned off, and the transistors 52-0 to 52-3 are turned on.

<Transistor 55>

Next, the transistor 55 will be explained. The transistor 55 transfers a voltage to the back gate line BG. One end of a current path of the transistor 55 is connected to the back gate line BG of the corresponding block BLK, the other end is connected to the signal line BGD, and its gate is commonly connected to the signal line TG.

For example, in the row decoder 11 corresponding to the selective block BLK0, the transistor 55 is turned on; in the row decoders 11-1 to 11-3 corresponding to the nonselective blocks BLK1 to BLK3, the transistor 55 is turned off.

1.1.4 Driver Circuit 16, 17

Next, the constitution of the driver circuit 16, 17 will be explained. The driver circuit 16, 17 transfers a voltage required for the write, readout, and erase of data to each of the signal lines CG0 to CG7, SGDD0 to SGDD3, SGSD0 to SGSD3, and BGD.

As shown in FIG. 5, the driver circuit 16, 17 includes CG drivers 60 (60-0 to 60-7), SGD drivers 61 (61-0 to 61-3), SGS drivers 62 (62-0 to 62-3), BG driver 64, and voltage divider 63.

The voltage divider 63 generates a voltage that is used in the block decoder 40 and the CG drivers 60. The CG drivers

60-0 to 60-7 respectively transfer a voltage required for the signal lines CG0 to CG7 (word lines WL0 to WL7) in accordance with page addresses. The SGD drivers 61-0 to 61-3 respectively transfer a voltage required for the signal lines SGDD0 to SGDD3 (selective gate lines SGD0 to SGD3). The SGS drivers 62-0 to 62-3 respectively transfer a voltage required for the signal lines SGSD0 to SGSD3 (selective gate lines SGS0 to SGS3). The BG driver 64 transfers a required voltage to the back gate line BG.

1.2 Test Method of the Memory Cell Array 10

Next, a test method of the memory cell array 10, with its constitution, will be explained. In this method, in case a defect exists in the memory cell array 10, the defect is managed at a unit of the string group GP.

1.2.1 Recording Method of Defect Information

Figure 6:
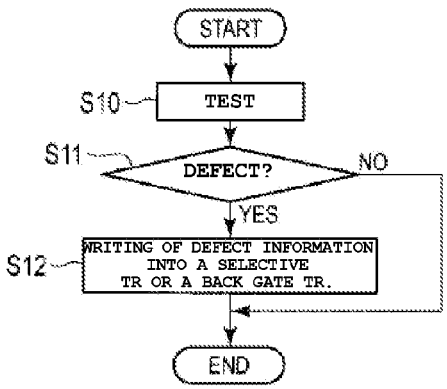
FIG. 6 is a flow chart showing a test method of the first embodiment.

First, a recording method of the defect information will be explained. FIG. 6 is a flow chart showing the outline of the test method that is applied to the NAND-type flash memory 1 before shipping. The test is carried out according to an instruction of a tester of the NAND-type flash memory 1. Here, the string group GP is sometimes simply called strings.

As shown in the figure, whether or not the memory cell transistors MT in the memory cell array 10 are operating normally is tested (step S10).

Next, if a defective memory cell is found in any of the strings (step S11, YES), the controller writes defect information into both of the selective transistors ST1 and ST2 or into the back gate transistor BT in the string (step S12). More specifically, electric charges are injected into the charge storage layer of the selective transistors ST1 and ST2 or into the back gate transistor BT to raise a threshold voltage thereof. The defect information is information for notifying that the string includes a defective cell and cannot be used.

Figure 7:
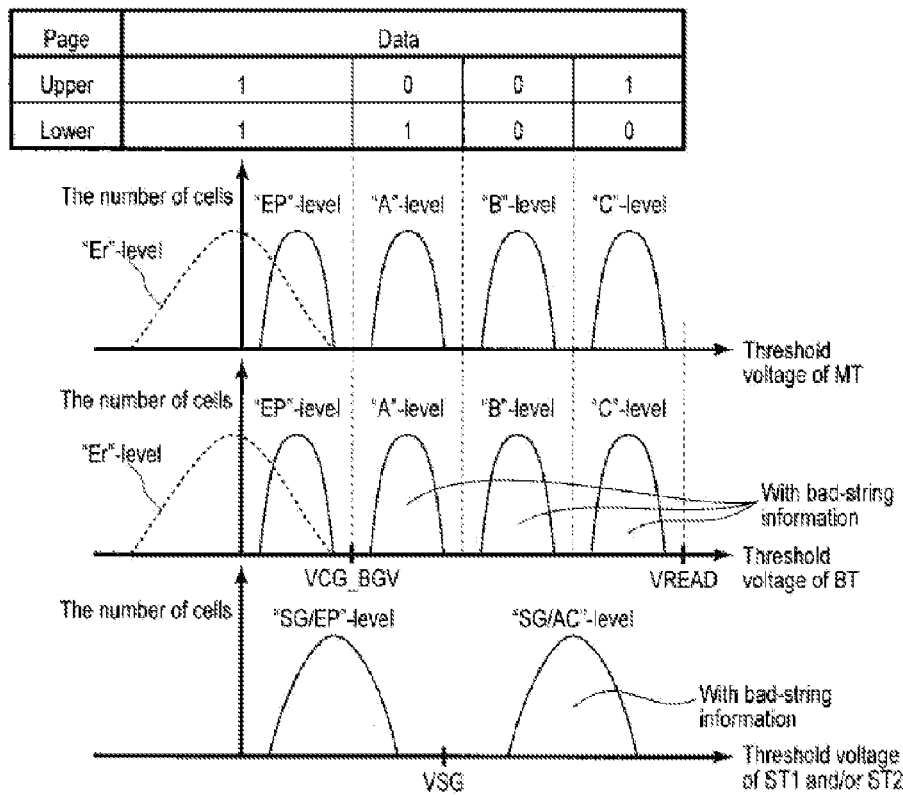
FIG. 7 is a diagram showing a threshold distribution of memory cells of the first embodiment.

FIG. 7 shows data, which can be processed by the memory cell transistors MT, and a threshold distribution of the memory cell transistors MT, back gate transistor BT, and selective transistors ST1 and ST2 of this embodiment.

As shown in the figure, each memory cell transistor MT can hold data of 2 bits, for instance, in accordance with its threshold. The 2-bit data, for example, are "11," "01," "00," and "10" in the order of increasing thresholds.

The threshold of the memory cells that hold the "11" data is an "Er" level or an "EP" level. The Er level is a threshold in a state, in which electric charges in the charge storage layer are pulled out and data are erased, and can adopt a negative value as well as a positive value. The EP level is a threshold in a state, in which electric charges are injected into the charge storage layer, are Er level or higher level, and have a positive value.

"01," "00," and "10" are also thresholds in a state in which electric charges are injected into the charge storage layer. The threshold of the memory cells, which hold the "01" data, are "A" level, which is higher than the Er level and the EP level. The threshold of the memory cells that hold the "00" data is "B" level, which is higher than the A level. The threshold of the memory cells that hold the "10" data is "C" level, which is higher than the B level. However, the relationship between the 2-bit data and the threshold is not limited to this relationship. For example, the "11" data may correspond to the "C" level, and the relationship between both of them can be appropriately selected.

The threshold of the back gate transistor BT is usually the Er level or EP level. This threshold is a level at which the back gate transistor BT is turned on in normal read and write operations. In other words, when data are read out or written, a voltage VCG_BGV is applied to the back gate line BG. This voltage, for example, is a voltage between the EP level and the A level.

On the contrary, if the bad string information is written, the threshold of the back gate transistor BT is set to a level higher than the VCG_BGV, for example, any of the A to C levels. Therefore, if the bad string information is written, the back gate transistor BT is always in an off state.

The threshold of the selective transistors ST1 and ST2 is usually set to the "SG/EP" level. This threshold is a level at which the selective transistors ST1 and ST2 are turned on when the selective gate lines SGD and SGS are selected and the voltage VSG is applied in normal read and write operations. This level, for example, is a value in a range from the EP level to the A level.

On the contrary, if the bad string information is written, the threshold of the selective transistors ST1 and ST2 is set to the "SG/AC" level. This level is higher than the VSG, for example, a value in a range from the B level to the C level. Therefore, if the bad string information is written, the selective transistors ST1 and ST2 are always in an off state.

1.2.2 Detection Method of Defective String

Next, a method for detecting a defective string by using the bad string information written by the method will be explained. A defective string is detected by reading data in a state in which all of the word lines WL are selected for each string.

Figure 8:
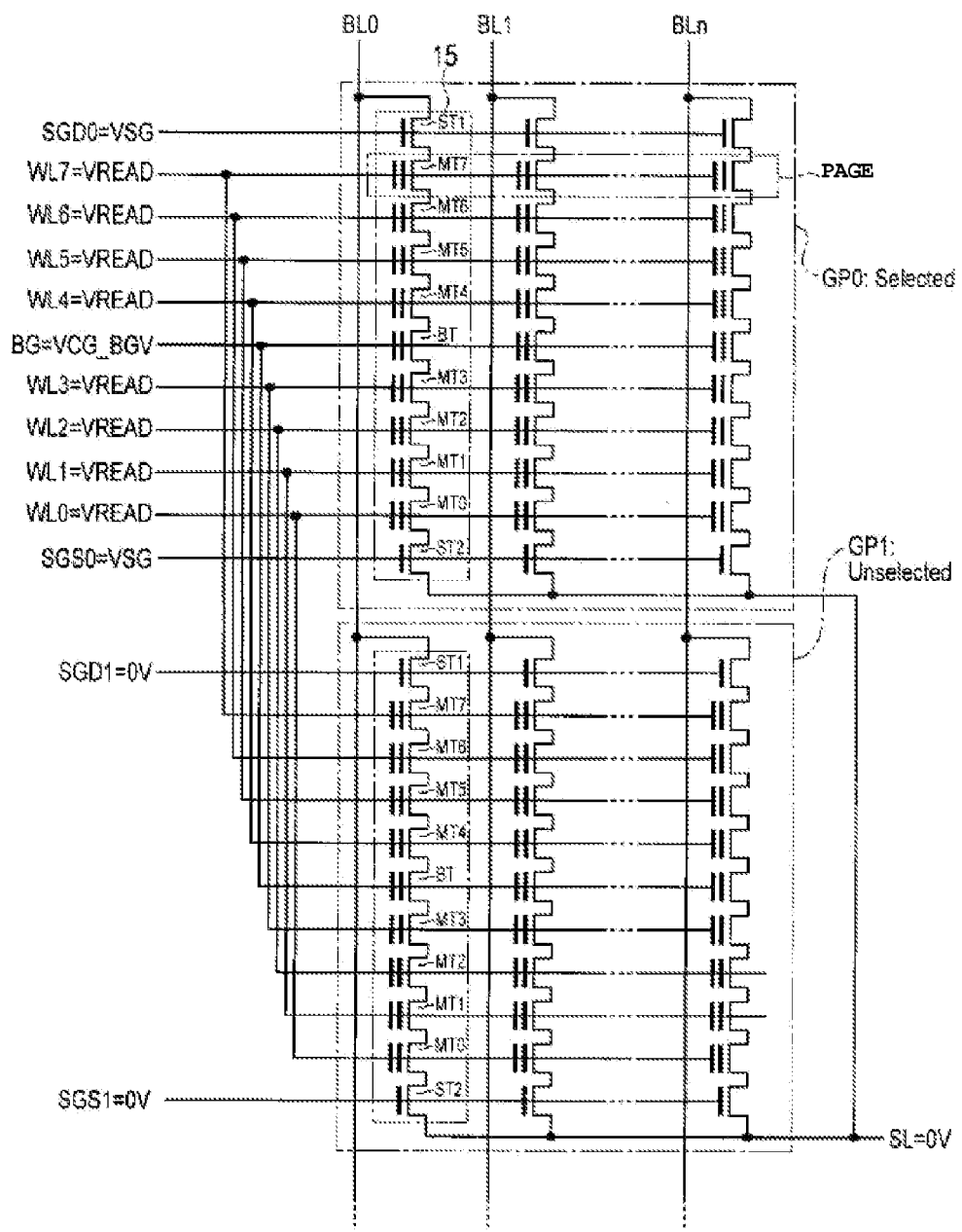
FIG. 8 is a circuit diagram showing the memory cells of the first embodiment.

FIG. 8 is a circuit diagram illustrating any of the blocks BLK and shows a state in which data are read out when the string group GP0 is selected. Here, in FIG. 8, there are 2 pieces of string; however, this number is only an example.

As shown in the figure, the voltage VREAD is applied to all of the word lines WL0 to WL7 by the CG driver 60. The voltage VREAD is a voltage for turning on the memory cell transistors MT, regardless of holding data, and this voltage is higher than the "C" level of FIG. 7.

In addition, the BG driver 64 applies the VCG_BGV to the back gate line BG, and the SGD driver 61-0 and the SGS driver 62-0 apply the VSG to the selective gate lines SGD0 and SGS0.

Here, 0 V is applied to the selective gate lines SGD1 to SGD3 and SGS1 to SGS3. Therefore, the string groups GP1 to GP3 are not selected.

In this state, the sense amplifier 12 senses the data read out to the bit lines BL and can detect whether the string is defective in accordance with the readout data. Next, the case where a defect exists and the case where a defect does not exist will be explained. In addition, in the following explanation, the case where the bad string information is written into the selective transistors ST1 and ST2 will be explained as an example, unless stated otherwise.

In the test for defective strings or blocks (a string test and a block test will be explained in the second embodiment) or a normal operation, for example, a defect is assumed when the state of the bit lines BL is "0" or "1," regardless of the readout result of the cells, because the defect in the bit lines BL is corrected by column redundancy, and the like. The stage for detecting a defective string, which is explained herein, is also similar. Therefore, at this stage, the readout result from the memory cell array can be correctly decided.

<The Case where a Selected String is not Defective>

Figure 9:
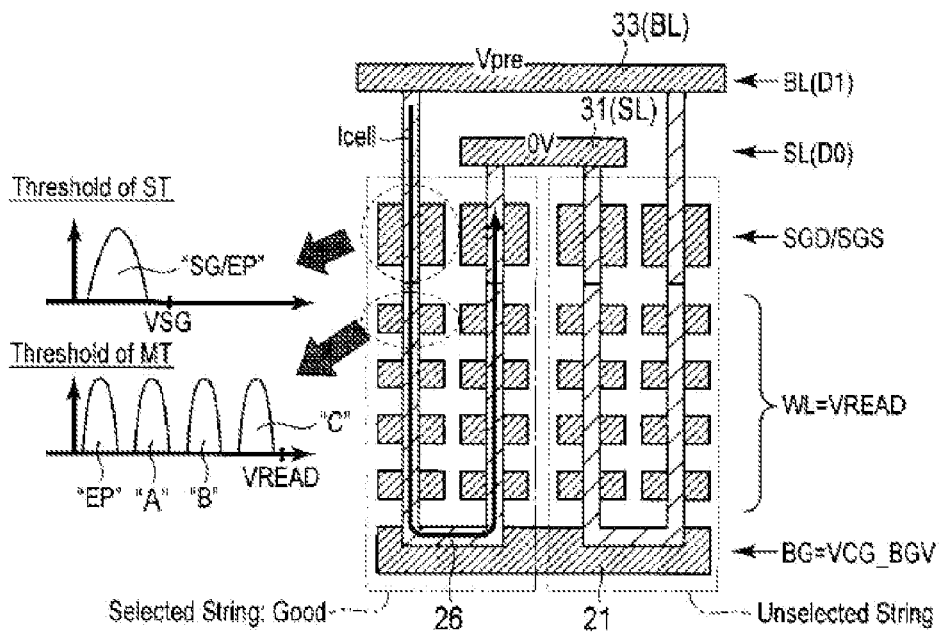
FIG. 9 is a cross section showing the memory cells of the first embodiment.

First, the case where a selected string has no defect will be explained with reference to FIG. 9 and FIG. 10. FIG. 9 is a cross section showing a partial area of the blocks BLK along the bit line direction and FIG. 10 is a circuit diagram showing the selected string.

As shown in FIG. 9, if the selected string is not defective, the threshold of the selective transistors ST1 and ST2 in this string is the SG/EP level. Therefore, the selective transistors ST1 and ST2 are set to an on state by applying the voltage VSG. In addition, all of the memory cell transistors MT are set to an on state, regardless of holding data, by applying the voltage VREAD.

Figure 10:
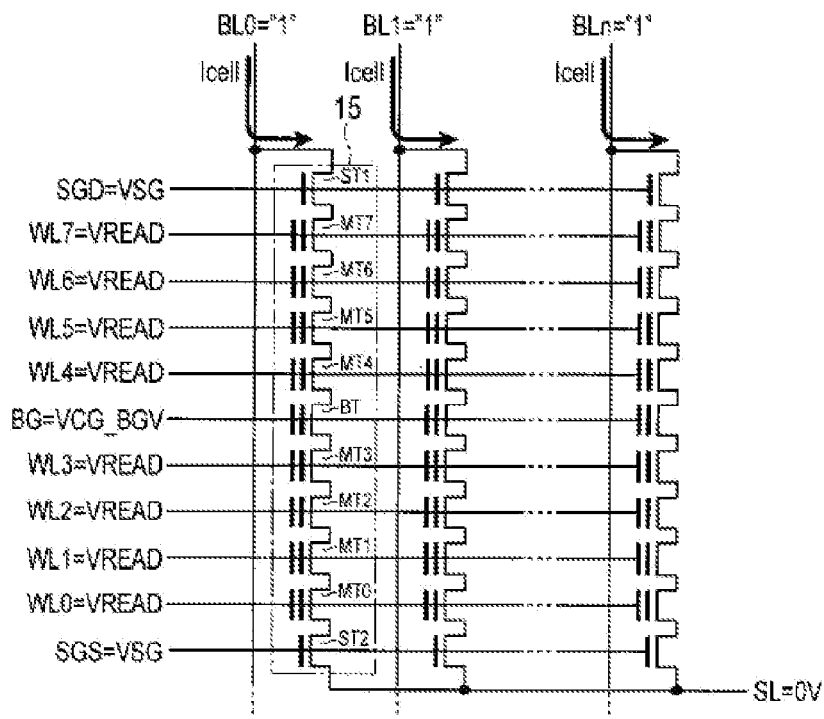
FIG. 10 is a circuit diagram showing the memory cells of the first embodiment.

As a result, as shown in FIG. 10, in all of the NAND strings 15 in the selected string group, a cell current Icell flows from the bit lines BL to the source line SL (the state of the bit lines BL, when the Icell flows, is defined as "1" state (the BL is at logic "L" level)).

In other words, when data are read out by applying the VREAD to all of the word lines WL, if all of the bit lines BL are "1," it can be decided that the selected string is not defective.

<The Case where a Selected String is Defective>

Figure 11:
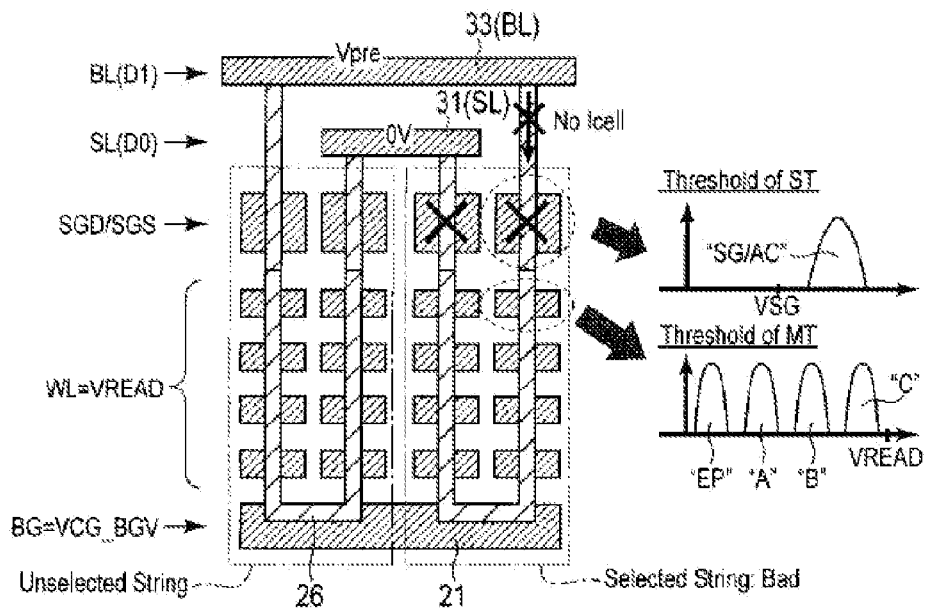
FIG. 11 is a cross section showing the memory cells of the first embodiment.

Next, the case where a selected string is defective will be explained with reference to FIG. 11 and FIG. 12. FIG. 11 is a cross section showing a partial area of the blocks BLK along the bit line direction and FIG. 12 is a circuit diagram showing a selected string.

As shown in FIG. 11, if a selected string is defective, the threshold of the selective transistors ST1 and ST2 in this string is the SG/AC level. Therefore, the selective transistors ST1 and ST2 maintain the off state, even if the voltage VSG is applied. All of the memory cell transistors MT are set to an on state, regardless of the holding data.

Figure 12:
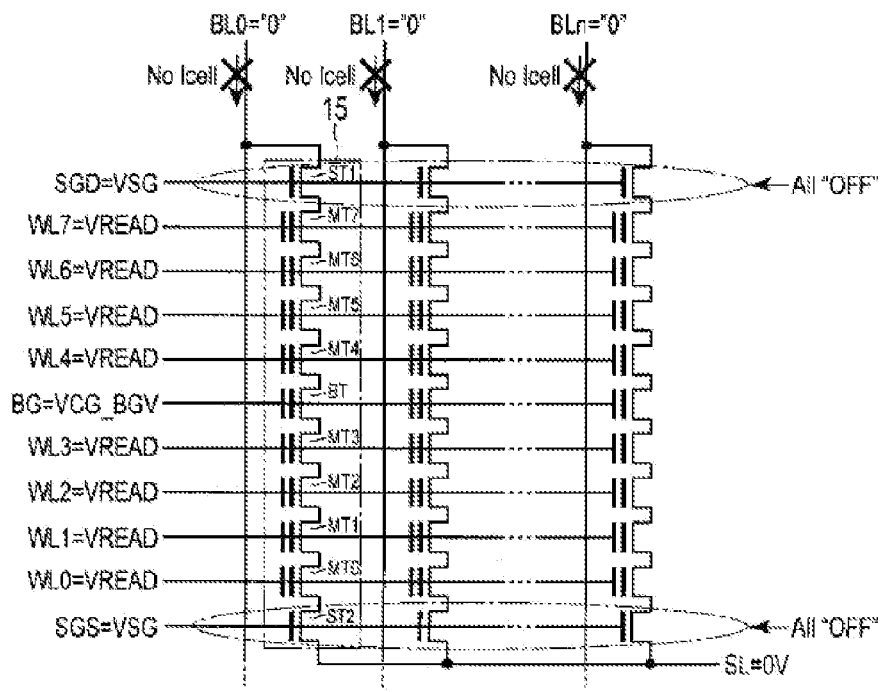
FIG. 12 is a circuit diagram showing the memory cells of the first embodiment.

As a result, as shown in FIG. 12, in all of the NAND strings in the selected string group, since the selective transistors ST1 and ST2 are in an off state, the cell current Icell does not flow (the state of the bit lines BL at that time is defined as "0" state (the BL is at logic "H" level)).

In other words, when data are read out by applying the VREAD to all of the word lines WL, if all of the bit lines BL are "0," it can be decided that the selected string group is defective.

Here, the operation is also similar in the case where the bad string information is written into the back gate transistor BT. In this case, the selective transistors ST1 and ST2 are in an on state; however, since the back gate transistor BT is in an off state, all of the bit lines BL are "0."

1.3 Erase Method of Data

Next, a data erase method of the NAND-type flash memory 1 of this embodiment will be explained. In this embodiment, the erase method depends on whether the bad string information is written in the selective transistors ST1 and ST2 or in the back gate transistor BT.

Figure 13:
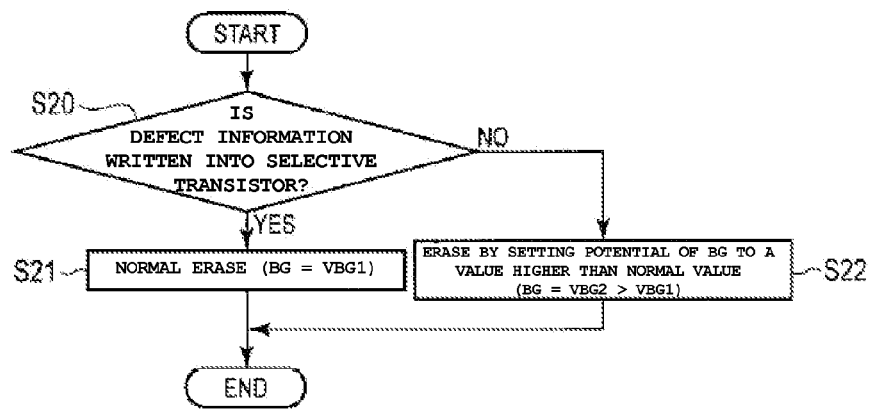
FIG. 13 is a flow chart showing an erase method of the first embodiment.

FIG. 13 is a flow chart showing the erase method. As shown in the figure, in case that the bad string information is written in the selective transistors ST1 and ST2 (step S20, YES), a normal erase method is carried out; for example, a voltage VBG1 is applied to the back gate line BG (step S21). On the contrary, in the case where the bad string information is written into the back gate transistor BT (step S20, NO), the potential of the back gate line BG is set to a value higher than a normal value to implement an erase operation (step S22). For example, a voltage VBG2 (>VBG1) is applied to the back gate BG. Therefore, the bad string information written into the back gate transistor BT can be prevented from being erased.

Figure 14:
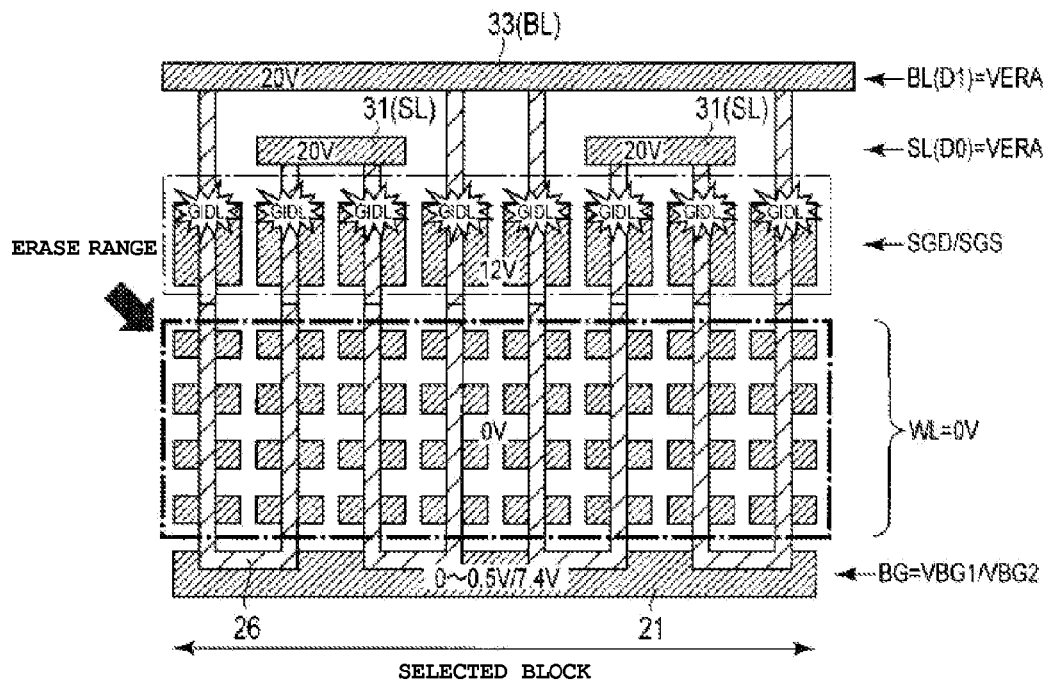
FIG. 14 is a cross section showing the memory cells of the first embodiment.

FIG. 14 is a cross section along the bit line direction of a selected block and shows an erase state of data.

As shown in the figure, an erase voltage VERA (for example, 20 V) is applied to the bit lines BL and the source line SL by the second driver 17. In addition, VERA−ΔV (for example, 12 V) is applied to the selective gate lines SGD and SGS by the SGD driver 61 and the SGS driver 62. Therefore, GIDL (gate inducted drain leakage) is caused at the selective gate end. Holes generated by the GIDL are introduced into a low-voltage pillar 26. For this reason, the potential of the pillar 26 is increased to the erase voltage VERA.

A voltage of 0 V is applied to all of the word lines WL. As a result, the holes are introduced into the charge storage layer of the memory cell transistors MT, erasing the data.

At that time, in a normal case, the VBG1 (for example, 0 V to 0.5 V) is applied to the back gate line BG. However, in case that the bad string information is written into the back gate transistor BT, the VBG2 (for example, 7.4 V) is applied.

Here, whether or not the data of the back gate transistor are erased can also be preset by a parameter. Based on this parameter, if an erase operation is implemented on the back gate transistor, the VBG1 can be applied (step S21); in a mode in which bad string information is written into the back gate transistor (the case where an erase operation is not implemented on the back gate transistor), the VBG2 can be applied (step S22). Alternately, neither an erase operation nor a write operation may be implemented on the back gate transistor.

1.4 Effects of this Embodiment

As an approach to improve the bit density of the NAND-type flash memory, layering is considered to be an alternative of the miniaturization that is in a nearly limited state. As one example, a layered NAND-type flash memory in which memory cells are layered using vertical transistors is proposed.

As a method for the layering, there is a method that collectively opens memory holes in layered word lines and forms memory cells in the memory holes. In the layering, it is necessary to bundle control gates (word lines) by several adjacent strings. The reason for this is that the control gates are increased along with the layering of the memory cells, whereas the number of metal wiring layers cannot be simply increased. Accordingly, if the number of control gates that are arranged is reduced by bundling the adjacent control gates in accordance with the number of layering of the memory cells, the number of metal wiring layers may not need to be increased. A set of these strings having common control gates is the blocks BLK, as shown in FIG. 1 and FIG. 2.

In a planar NAND-type flash memory in which memory cells are two-dimensionally arranged on a semiconductor substrate, in case a defect like a short circuit occurs, its block is regarded as a defective block, allowing no access to it. Similarly, in the layered NAND-type flash memory, in case a defect occurs, it is considered that its block is processed as a defective block.

However, as explained in FIG. 1 and FIG. 2, the number of memory cells in one block in the layered NAND-type flash memory is very large. As shown in FIG. 1, the number of memory cells in one string (one string group GP) is about the number of memory cells in one block BLK in the planar NAND-type flash memory. In other words, one defective block BLK in the layered NAND-type flash memory corresponds to several defective blocks BLK in the planar NAND-type flash memory.

From this point of view, in the constitution of this embodiment, a good state/a defective state of memory cells are managed at the granularity of a string unit (string group GP unit). Therefore, for example, even if a defect occurs, the number of strings affected is reduced, thus being able to more efficiently use the memory space.

In addition, in the constitution of this embodiment, the bad string information is written into the selective transistors ST1 and ST2 or into the back gate transistor BT. Therefore, the bad string information can be held with higher reliability. This point will be explained below in detail.

Figure 15:
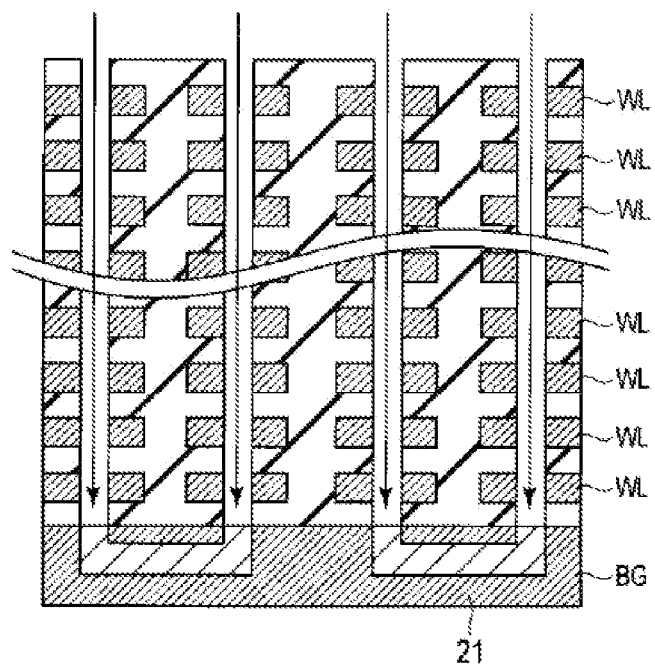
FIG. 15 is a cross section of the memory cell array.

FIG. 15 is a cross section of the memory cell array 10. In manufacturing the memory cell array 10, first, the back gate transistor BT is formed. Next, on the back gate transistor BT, interlayer dielectrics and word line layers are layered over a multilayer. Then, as shown in FIG. 15, several word line layers are collectively etched to form memory holes. The block insulating layer 25a, charge storage layer 25b, tunnel insulating layer 25c, and semiconductor layer 26 are then formed, and the selective transistors ST1 and ST2 are formed.

Therefore, several memory cell transistors MT are formed by the same process. In addition, since very deep memory holes are formed and the memory cell transistors MT are formed in the memory holes, a defect such as clogging of the memory holes may occur.

On the contrary, the selective transistors ST1 and ST2 and the back gate transistor BT are formed by a process different from that of the memory cell transistors MT. In addition, since no deep memory holes are required, it is considered that the probability of occurrence of a defect is lower as compared with the memory cell transistors MT.

Therefore, when the bad string information is written into the selective transistors ST1 and ST2 and the back gate transistors BT, the flow of the cell current through them is prevented by turning off these transistors as shown in FIG. 11 and FIG. 12.

2. Second Embodiment

Next, the semiconductor memory device of the second embodiment will be explained. This embodiment relates to details of a test method for detecting a defective string and a defective block and for conducting an operation until the detected defect information is written into a ROM fuse. In the following, only the elements that are different from the first embodiment will be explained.

2.1 Test Method of NAND-Type Flash Memory 1
2.1.1 Entire Flow of Sequence

Figure 16:
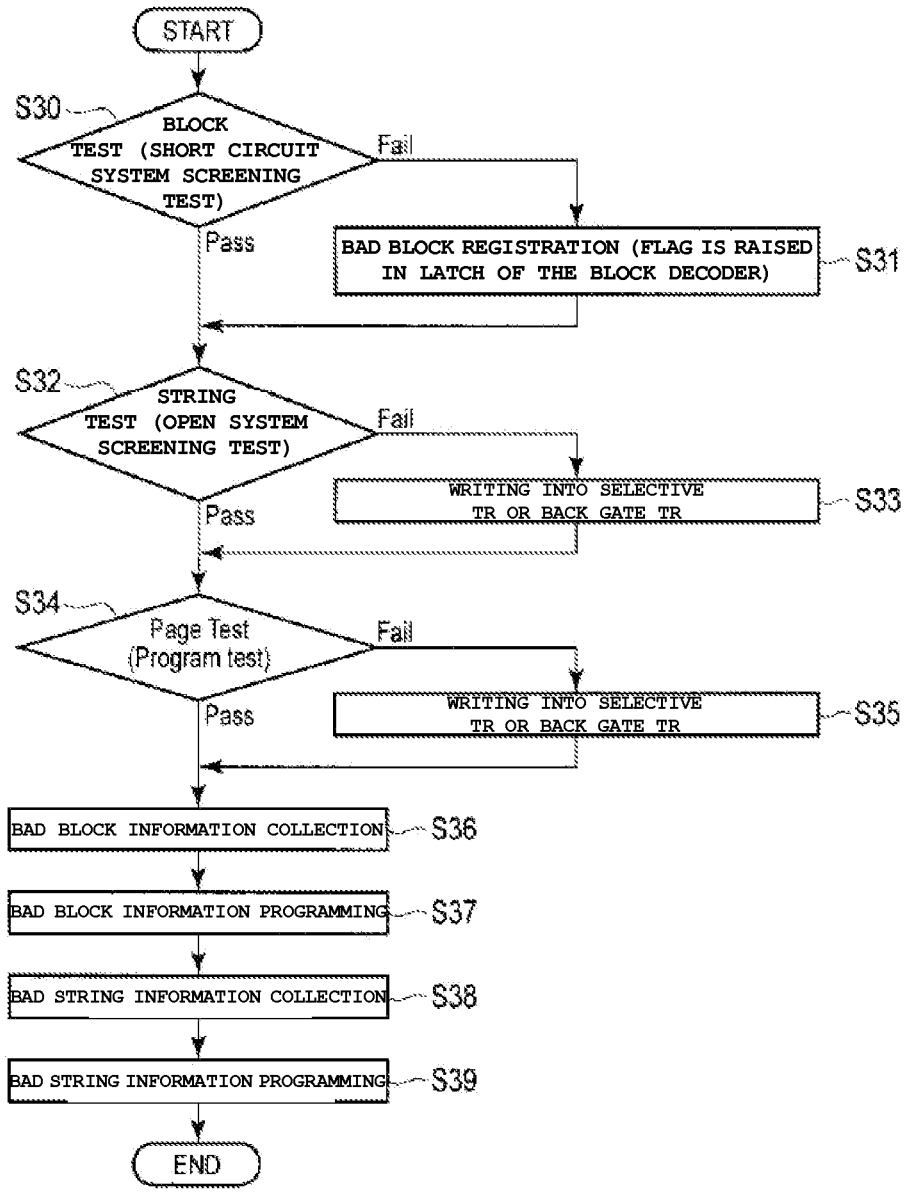
FIG. 16 is a flowchart showing a test method of a second embodiment.

First, the outline of the flow of a test sequence will be explained with reference to FIG. 16. FIG. 16 is a flowchart showing the flow of a processing from a test of the memory cell transistors MT to the writing of the defect information based on the test result into the memory cell array 10, and each step is implemented by the control of a tester.

First, the tester carries out a block test (step S30). This test is an existence inspection for a defect (e.g., defective block, which cannot be rescued at a string unit and must prohibit the use at a block unit). One example of such a test is a short-circuit system defect screening test.

If the block test fails (fail) (step S30, FAIL), the tester registers the block as a bad block (step S31). In other words, the tester sets a flag in a latch of the block decoder 40 corresponding to this block BLK, so that the block decoder 40 is prevented from selecting the corresponding block BLK.

Next, the tester carries out a string test (step S32). This is a test for string defects, for example, an open-system defect screening test.

If the screening fails (step S32, FAIL), the tester writes bad string information (hereinafter referred to as "bad string information") into both of the selective transistors ST1 and ST2 or into the back gate transistor BT in this string (step S33). In other words, the threshold of the selective transistors ST1 and ST2 or the back gate transistor BT is set to a value in which these transistors are always in an off state. Hereinafter, the write operation mode in which the bad string information is written into both of the selective transistors ST1 and ST2 or into the back gate transistor BT is called a bad string mode (BSM: bad string mode).

Next, the tester carries out a page test (step S34). This is a test for page defects, for example, a test for inspecting whether or not a program of data can be normally implemented.

If the page test fails (step S34, FAIL), the tester writes the bad string information into both of the selective transistors ST1 and ST2 or into the back gate transistor BT in this string (step S33). In other words, the threshold of the selective transistors ST1 and ST2 or the back gate transistor BT is set to a value in which these transistors are always in an off state.

Through the processing of steps S30 to S35, the test of the memory cell transistors MT and marking of the test results (e.g., defect information) are completed. Next, the tester writes the marked defect information into a prescribed area of the memory cell array 10.

First, the tester collects bad block information (step S36). This collection is carried out by checking the flag in the block decoder 40. The tester then writes the bad block information into the ROM fuse of the memory cell array 10 (step S37).

Next, the tester collects bad string information (step S38). The bad string information is collected by implementing a read operation by applying the VREAD to all of the word lines WL as explained in FIG. 8 to FIG. 12 of the first embodiment. The tester then writes the bad string information into any area of the memory cell array 10 (step S39).

Details of the respective steps will be explained below.
2.1.2 Block Test

Figure 17:
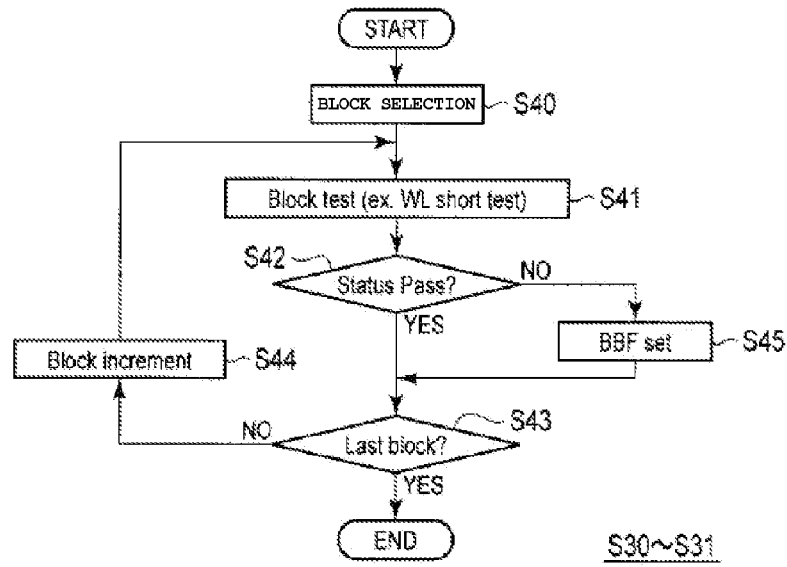
FIG. 17 is a flow chart showing the test method of the second embodiment.

The block test will be explained with reference to FIG. 17. FIG. 17 is a flow chart showing the details of steps S30 and S31.

First, the tester selects any of the blocks BLK (step S40). Next, the tester applies the block test to the selected block BLK (step S41). A word line short-circuit test, for example, may be used as the block test. In case a short circuit occurs between the word lines WL, for the block BLK including this defect, it is desirable for the entire block BLK not to be used.

When the block test is passed (step S42, YES), if the block BLK is the last block (step S43, YES), the processing is finished. If the block is not the last block (step S43, NO), a similar processing is repeated for the next block BLK (step S44).

Figure 18:
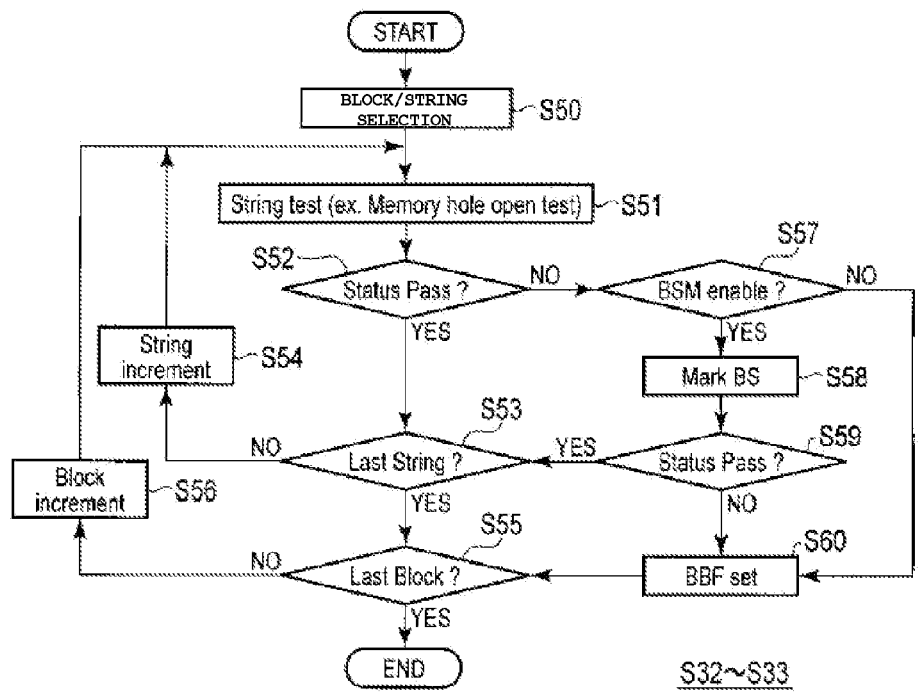
FIG. 18 is a flow chart showing the test method of the second embodiment.

If the block test fails (step S42, NO), the tester sets a bad block flag (BBF: bad block flag) in the block decoder 40 (step S43). Next, the process proceeds to step S43.
2.1.3 String Test Next, the string test will be explained with reference to FIG. 18. FIG. 18 is a flow chart showing the details of steps S32 and S33.

First, any of the strings (string groups GP) of any of the blocks BLK is selected (step S50). Next, the tester applies the string test to the selected string (step S51). An open test of the memory holes is an example of the string test that can be applied. For example, in the case where the memory holes are clogged so that the string is open, it is desirable for the string group GP, including the memory holes, not to be used. However, since the other string groups GP are not negatively affected, it is unnecessary to indicate the entire block as being defective.

When the string test is passed (step S52, YES), if the string is not the final string (step S53, NO), the next string is selected (step S54), and the process returns to step S51. If the string is the final string (step S53, YES) and is a string in the last block BLK (steps S55, YES), the processing is completed. If the string is not a string in the last block BLK (step S55, NO), the next block is selected (step S56), and the process returns to step S51.

At step S52, if the string test fails (step S52, NO), the tester decides whether or not the bad string mode BSM is applicable (step S57). This decision, for example, can be made by storing information showing whether or not the BSM is applicable in any register of the NAND-type flash memory 1 and having the tester refer to this stored information.

If the bad string mode BSM is applicable (step S57, YES), the tester marks the bad string information on the selective transistors ST1 and ST2 or on the back gate transistor BT in the string (step S58). Next, if this marking is successful (step S59, YES), the process proceeds to step S53.

If the BSM is not applicable (step S57, NO) or the marking of step S58 fails (step S59, NO), the tester sets the bad block flag BBF in the corresponding block decoder 40 (step S60). In other words, in this case, since the rescue of the string unit is impossible, the entire block is regarded as defective.

2.1.4 Page Test

Figure 19:
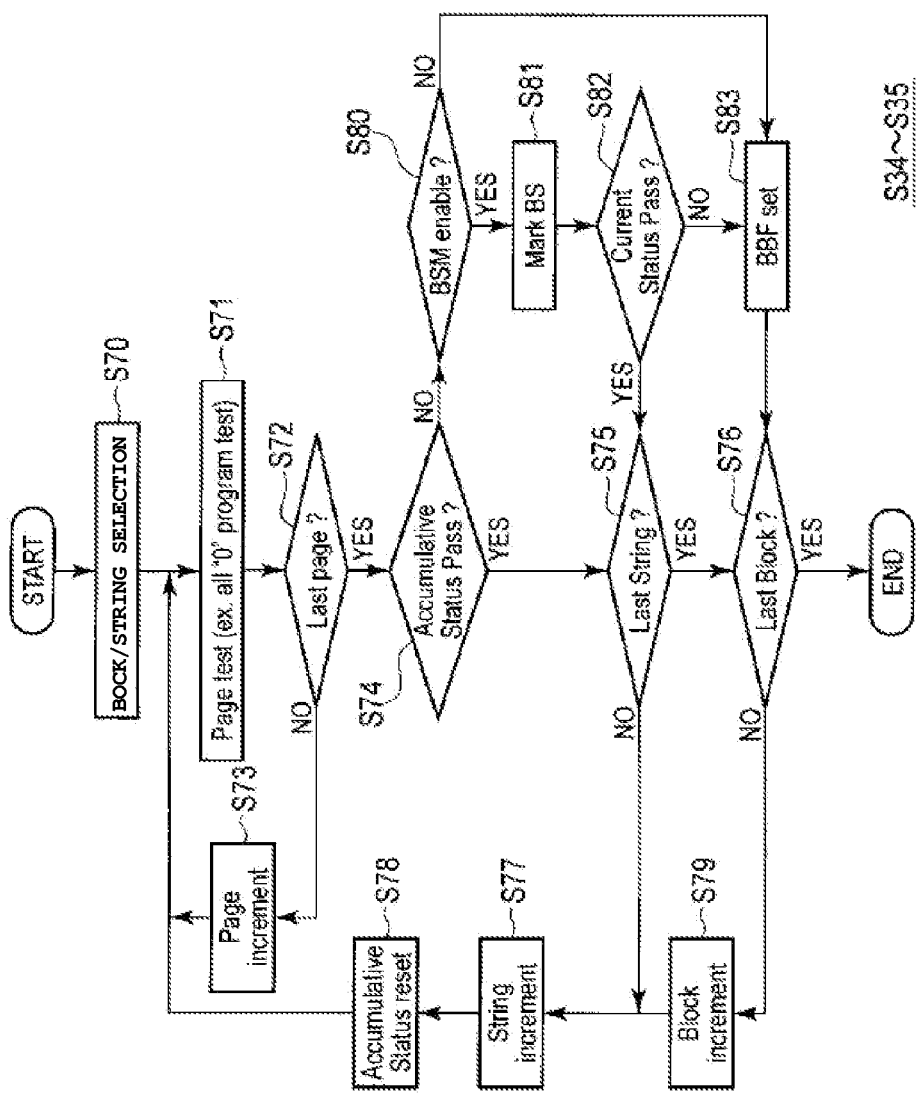
FIG. 19 is a flow chart showing the test method of the second embodiment.

Next, the page test will be explained with reference to FIG. 19. FIG. 19 is a flow chart showing the details of steps S34 and S35.

First, the tester selects any of the pages of any of the strings (string groups GP) in any of the blocks BLK (step S70). Next, the tester applies the page test (step S71). A write test of page data in which all of the bits are "0" is an example of the page test that can be used.

When the page test is passed (step S72, YES), if the page is not the last page in the string (step S72, NO), the next page is selected (step S73), and the process returns to step S71. The processing is completed if the page is the last page (step S72, YES), if the page test for all of the pages is successful (step S74, YES), if the string is the last string in the corresponding block BLK (step S75, YES), and if the corresponding block BLK is the last block (step S76, YES).

At step S75, if the string is not the last string (step S75, NO), the tester selects the next string (step S77), resets the status in the register (step S78), and returns to step S71.

At step S76, if the block is not the last block (step S76, NO), the next block BLK is selected (step S79), and the process proceeds to step S77.

At step S74, if the page test for any of the pages fails (step S74, NO), the tester decides whether or not the bad string mode is applicable (step S80).

If the BSM is applicable (step S80, YES), the tester marks the bad string information on the selective transistors ST1 and ST2 or on the back gate transistor BT in the string (step S81). Next, if this marking is successful (step S82, YES), the process proceeds to step S75. Whether or not the marking is successful can be decided by referring to only the current status instead of the cumulative status.

If the BSM is not applicable (step S80, NO) or the marking of step S81 fails (step S82, NO), the tester sets the bad block flag BBF in the corresponding block decoder 40 (step S83). In other words, in this case, since the rescue of the string unit is impossible, the entire block is regarded as defective.

2.1.5 the Write Operation of Bad Block Information

Figure 20:
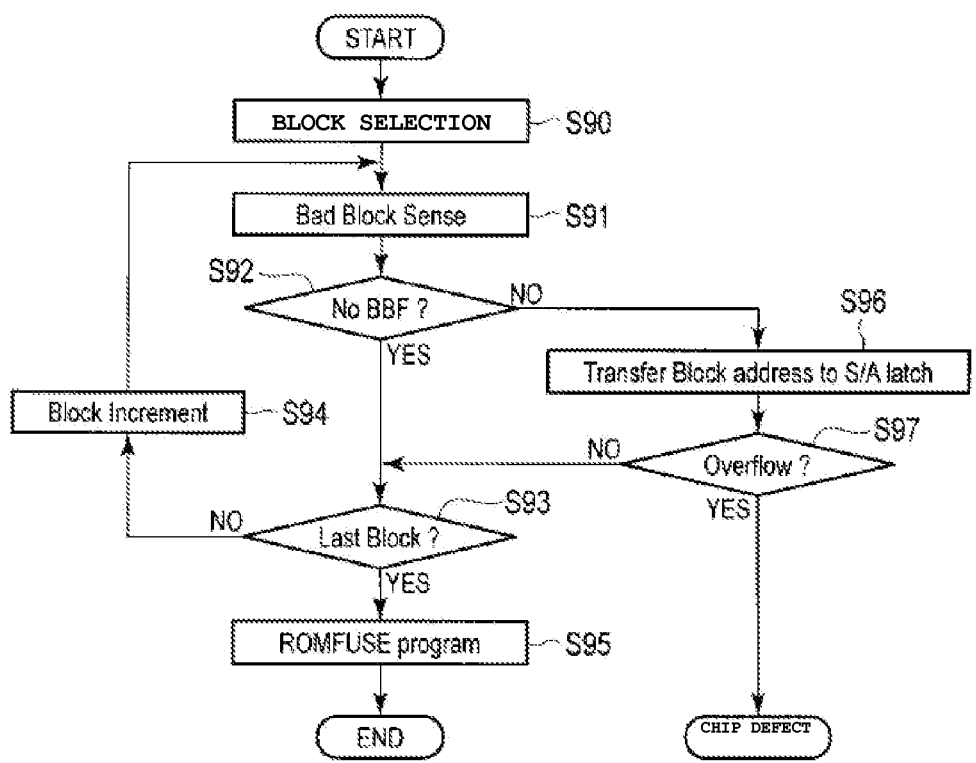
FIG. 20 is a flow chart showing the test method of the second embodiment.

Next, a process for writing the bad block information into the memory cell array 10 will be explained with reference to FIG. 20. FIG. 20 is a flow chart showing the details of steps S36 to S37.

First, the tester selects any of the blocks BLK (step S90). Next, the tester applies a bad block sense (step S91). This is a process for deciding whether or not the selected block BLK is a bad block. For example, the decision can be made by the existence of the bad block flag BBF in the block decoder 40.

If the bad block flag BBF is set (step S72, NO), the block address of the block BLK is transferred to a latch circuit of the sense amplifier 12 (step S96). The latch circuit of the sense amplifier 12 is an overflow (step S97, YES); that is, if the number of the block address in which the BBF has been set exceeds a prescribed number, the NAND-type flash memory 1 is regarded as a defective product.

This process is repeated until the last block (step S93, NO, step S94). Next, if the bad block sense is applied to all of the blocks BLK, the tester writes the block address transferred to the latch circuit of the sense amplifier 12 into the ROM fuse of the memory cell array 10 (step S95).

Here, the ROM fuse is an area that is set for read only in the memory cell array 10; in this area, when power is input, information is automatically read out.

2.1.6 the Write Operation of Bad String Information

Figure 21:
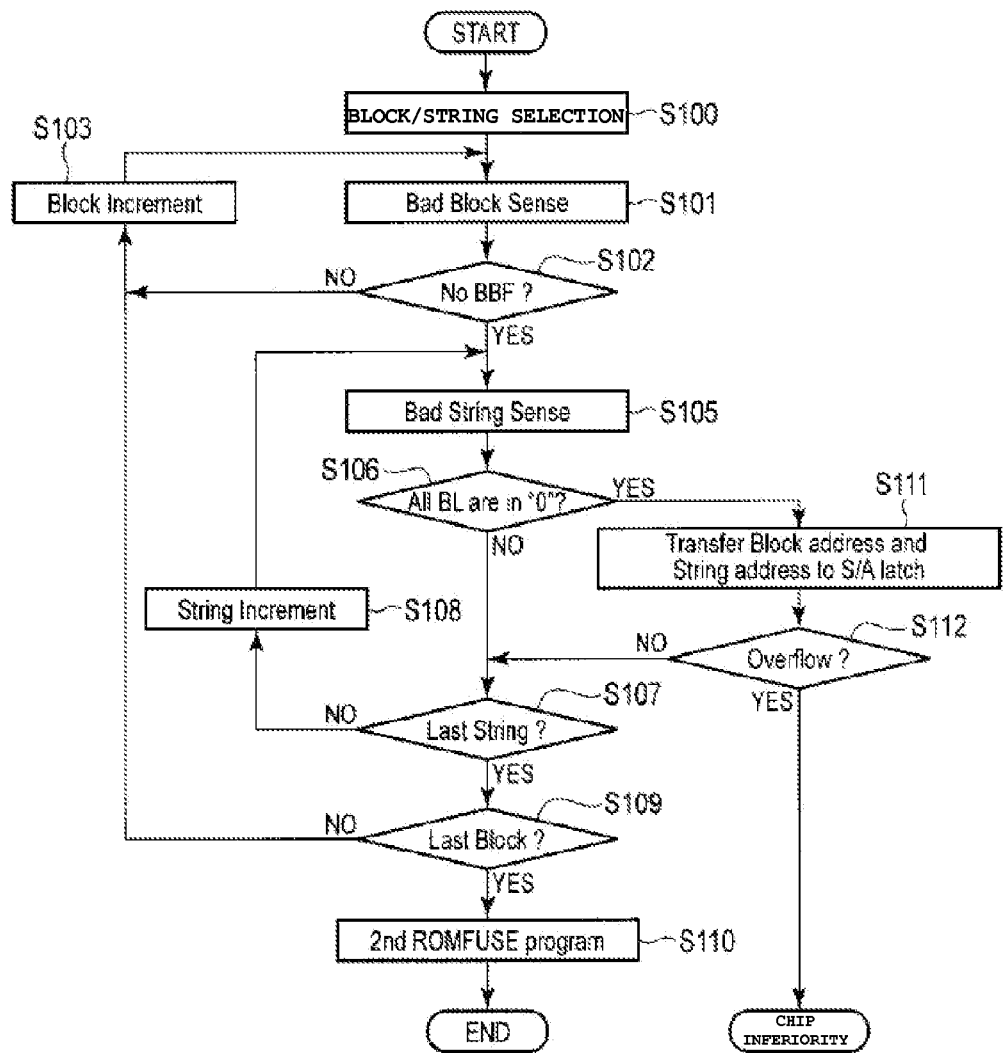
FIG. 21 is a flow chart showing the test method of the second embodiment.

Next, a processing for writing the bad string information into the memory cell array 10 will be explained with reference to FIG. 21. FIG. 21 is a flow chart showing the details of steps S38 and S39.

First, the tester selects any of the strings (string groups GP) of any of the blocks BLK (step S100). Next, the tester applies a bad block sense (step S101). This is a process similar to that of step S91, as previously explained. If the selected block BLK is a bad block (step S102, NO), the next block is selected (step S103), and the process returns to step S101.

If the selected block BLK is not a bad block (step S102, YES), the tester applies a bad string sense (step S105). This process, as previously explained, is carried out by implementing the read operation as shown in FIG. 8 to FIG. 12 of the first embodiment.

As a result of the read operation, if all of the bit lines BL are "0" (step S106, NO), that is, in the case of FIG. 11, and FIG. 12, it can be decided that the bad string information is written into the selective transistors ST1 and ST2 or in the back gate transistor BT. Therefore, the block address of the selected block BLK and the string address of the selected string are transferred to the latch circuit of the sense amplifier 12 (step S111). If the latch circuit of the sense amplifier 12 is an overflow (step S112, YES), the tester decides that the NAND-type flash memory 1 is defective.

This process is repeated until the last string of the selected block has been processed (step S107, NO, step S108). In addition, a similar process is repeated for all the blocks BLK (step S109, NO, step S103).

Next, if the bad string sense is applied to all of the blocks BLK, the tester writes the block address and the string address transferred to the latch circuit of the sense amplifier 12 into a prescribed area (hereinafter, referred to a second ROM fuse) of the memory cell array 10 (step S110).

The second ROM fuse is an area different from the ROM fuse into which the bad block address is written; in this area, when a power is input, information is not automatically read out. However, similar to the ROM fuse, the second ROM fuse is also an area that is not used to hold net user data but that is used to hold various kinds of setup data; in this area, direct access from a user (host appliance) is prohibited, or only a limited access is possible.

2.2 Effect of this Embodiment

The effect explained in the first embodiment, as previously described, can be applied to this embodiment.

3. Third Embodiment

Next, the semiconductor memory device of the third embodiment will be explained. This embodiment relates to a constitutional example of the ROM fuse and the second ROM fuse explained in the second embodiment and a method for reading out information written into these areas by a controller. In the following, only the elements that are different from the first and the second embodiments will be explained.

3.1 ROM Fuse and Second ROM Fuse

FIG. 22 is a schematic diagram showing the memory cell array 10. As shown in the figure, areas called FROM (Fuse ROM), CROM (Controller ROM), and NROM are included in the memory cell array 10. The FROM corresponds to the ROM fuse explained in the second embodiment, and the CROM corresponds to the second ROM fuse. The NROM is an ordinary ROM area, and this area is a ROM area accessible to a user (host appliance). These areas are installed in any of the blocks, and a spare is also installed in a separate block.

FIG. 23 is a schematic diagram showing a data structure in the FROM and the CROM. As shown in the figure, the FROM holds trimming data, bad column information, and bad block information. The CROM stores various information required for controlling and managing the NAND-type flash memory 1 by the controller in addition to the bad string information.

FIG. 24 is a schematic diagram showing a data structure of the bad string information in the CROM. As shown in the figure, the CROM includes the valid field, the block address field, and the string address field. The valid field shows whether the CROM is valid or invalid. For example, it is valid when "1" is set. The block address field and the string address field respectively hold the block address and the string address of a bad string. In the example of FIG. 24, the string 1 and the string 5 of the block BLK0 and the string 10 of the block BLK5 are registered as bad strings.

FIG. 25 is a schematic diagram showing another data structure of the bad string information in the CROM. As shown in the figure, the CROM includes the valid field, the block address field, and the string address field. The valid field is similar to that of FIG. 24. The block address field holds a block address including a bad string. The string field is installed as many times as the total number of strings that are included in one block BLK. In addition, "1" is set in the field corresponding to the bad string, and "0" is set in the field corresponding to a normal string.

In the example of FIG. 25, the string 3 and the string 7 of the block BLK0, the string 1, the string 3, and the string 5 of the block BLK2, and the string 1 of the block BLK10 are registered as bad strings.

3.2 Transfer Operation of Defect Information to the Controller

Figure 26:
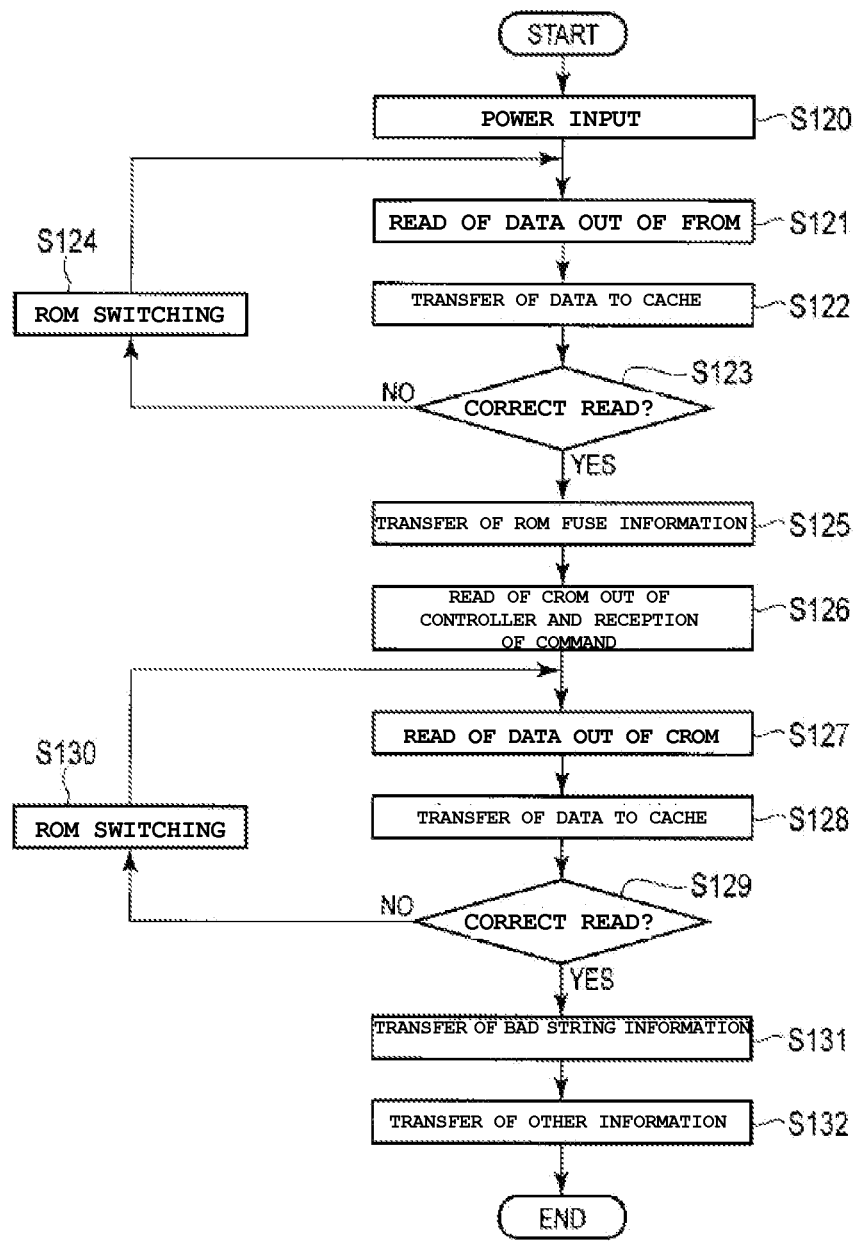
FIG. 26 is a flow chart showing a defect information readout method of the third embodiment.

Next, an operation for transferring bad block information and bad string information to the controller will be explained with reference to FIG. 26. Here, the process of FIG. 16 to FIG. 21 explained in the second embodiment, for example, is a processing that is implemented by a tester during the manufacturing process. The following operation is a process that is implemented in the NAND-type flash memory 1 each time power is input after shipping the NAND-type flash memory 1.

First, power is input into the NAND-type flash memory 1 by the controller (step S120). Therefore, the NAND-type flash memory 1 reads data out of the FROM according to the control of a sequencer (step S121) and transfers the data to a cache memory (step S122). This readout (POR: Power on Read) is implemented without receiving a read instruction from the controller. In addition, step S121 may also be implemented by receiving a reset instruction from the controller. If the data are not correctly read out (step S123, NO), this fuse memory is switched to a spare FROM, and the readout of data is attempted again (step S124). If the data are correctly read out (step S123, YES), the read information (including bad block information) is transferred to the controller (step S125).

After receiving the information, the controller carries out a process such as setting the bad block flag BBF in the row decoder 11.

Next, the NAND-type flash memory 1 receives a CROM read command from the controller at any time (step S126). Therefore, in response to this command, the NAND-type flash memory 1 reads data from the CROM according to the control of the sequencer (step S127) and transfers the data to the cache memory (step S128). If the data are incorrectly readout (step S129, NO), this controller memory is switched to a spare CROM, and the readout of data is attempted again (step S130). If the data are correctly read out (step S129, YES), first, the bad string information is transferred to the controller (step S131), and the other information in the CROM is then transferred to the controller (step S132). It is important to note that the sequence of the steps S131 and S132 may be reversed.

3.3 Effect of this Embodiment

The bad string information of the BSM method explained in the first and the second embodiments can be transferred to the controller by employing the method of this embodiment.

4. Fourth Embodiment

Next, the semiconductor memory device of the fourth embodiment will be explained. This embodiment relates to an erase verify at a time of data erase in the NAND-type flash memory 1 explained in the first to the third embodiments. In the following, only the elements that are different from the first to the third embodiments will be explained.

4.1 First Erase Method

Figure 27:
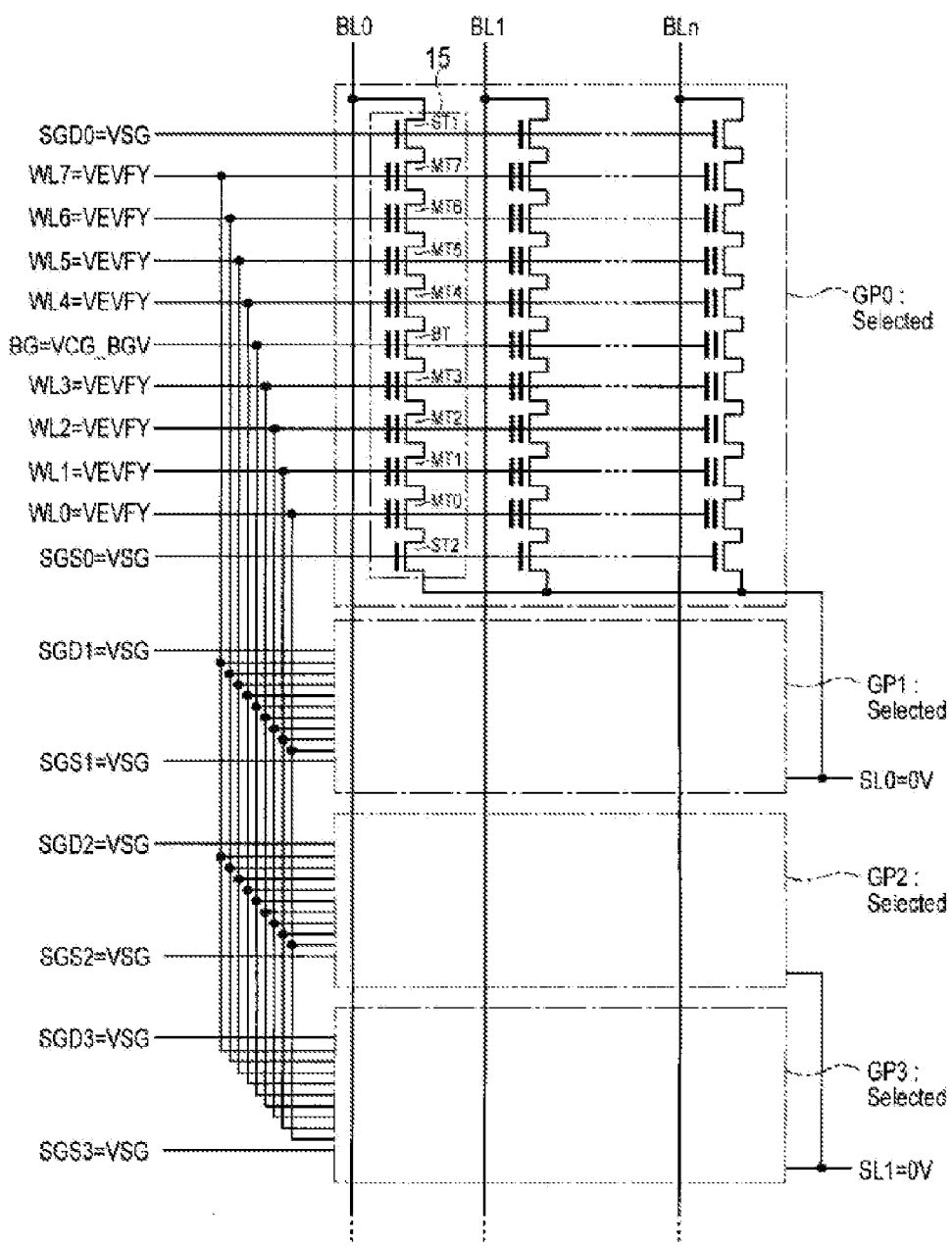
FIG. 27 is a circuit diagram showing a memory cell array of a fourth embodiment.

First, a first erase method will be explained. FIG. 27 is a circuit diagram illustrating the memory cell array and shows an erase verify state.

According to the first method, at the time of erase verify, the row decoder 11 selects all of the strings in the block BLK to be erased. In other words, as shown in FIG. 27, VEVFY is applied to all the word lines WL, and VSG is applied to all the selective gate lines SGD and SGS. Another way of explaining this is that data are collectively read out of all the strings. Here, the VEVFY is a verify level that is an upper limit of the Er level or EP level.

Figure 28:
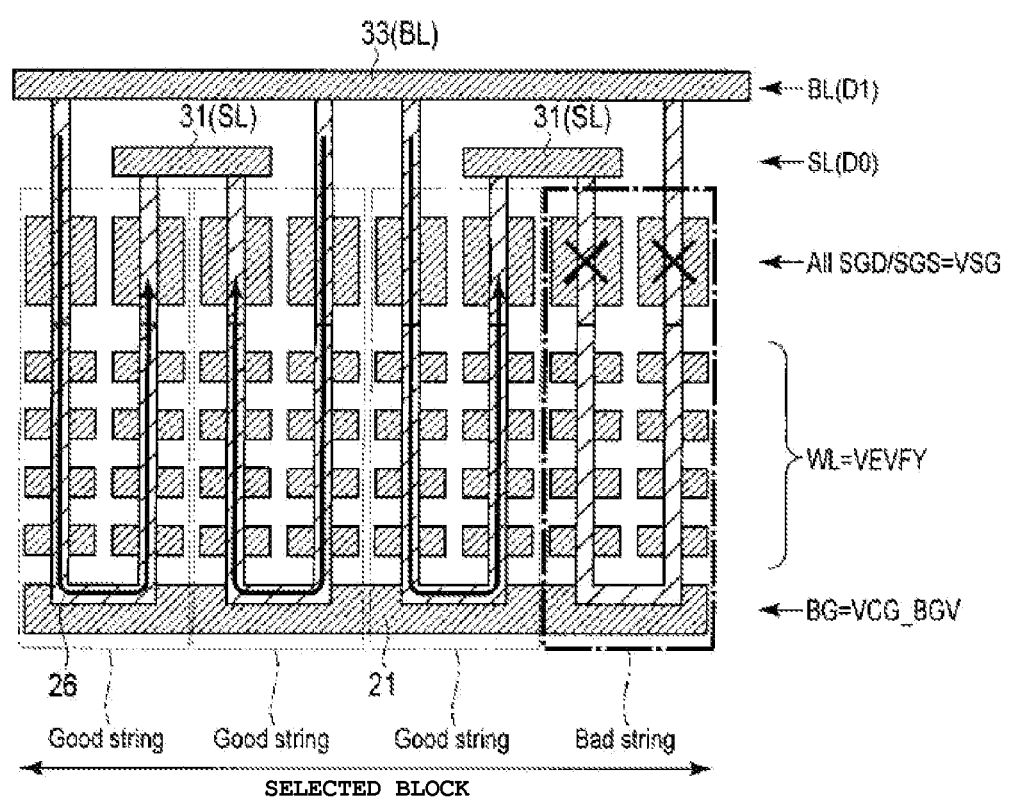
FIG. 28 is a cross section showing the memory cell array of the fourth embodiment.

FIG. 28 is a cross section illustrating the block BLK along the bit line direction and shows the case where the block to be erased includes one bad string.

As shown in the figure, in the bad string, the selective transistors ST1 and ST2 or the back gate transistor BT is set to an off state (a penalty mark in the figure). Therefore, no cell current flows to the bad string from the bit lines BL. However, in the other normal strings, the selective transistors ST1 and ST2 and the back gate transistor BT are in an on state. Therefore, if the threshold of the memory cell transistors MT in the normal strings is lowered to a desired value, a cell current flows to the source line SL from the bit lines BL via the strings.

Therefore, the potential of the bit lines BL is lowered, and the erase verify is passed.

4.2 Second Erase Method

Next, a second erase method will be explained. The second method is a method that applies erase verify to each string. In other words, in FIG. 27, first, the VSG is applied to the selective gate lines SGD0 and SGS0, and 0 V is applied to the other selective gate lines SGD1-3 and SGS1-3, so that only the string group GP0 is selected and subjected to the erase verify. Next, the VSG is applied to the selective gate lines SGD1 and SGS1, and 0 V is applied to the other selective gate lines SGD0, SGD2 and SGD3, SGS0, and SGS2 and SGS3, so that only the string group GP1 is selected and subjected to the erase verify. Thereafter, only the string group GP2 and only the string group GP3 are similarly, sequentially selected and subjected to the erase verify.

Figure 29:
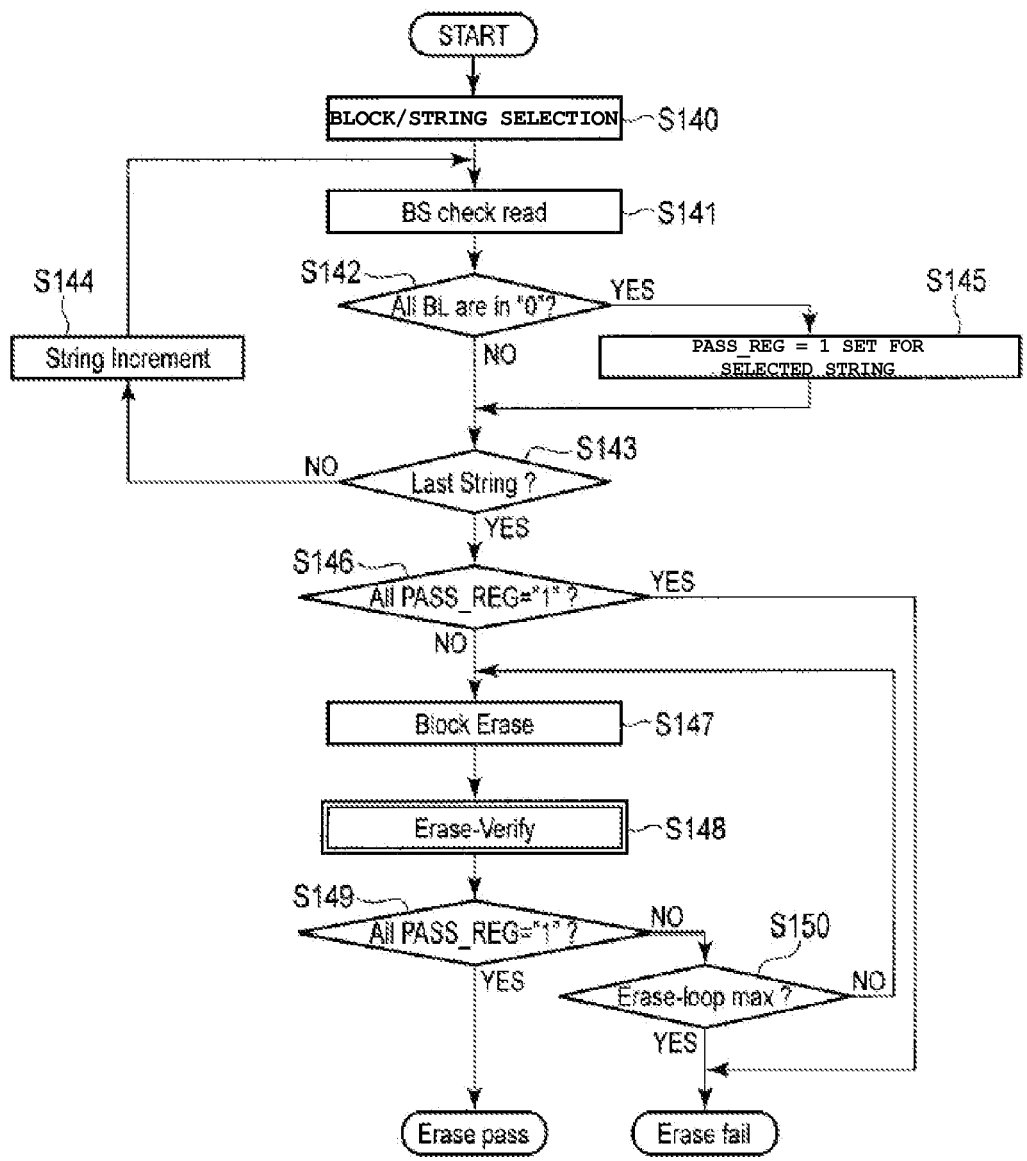
FIG. 29 is a flow chart showing an erase method of the fourth embodiment.
Figure 30:
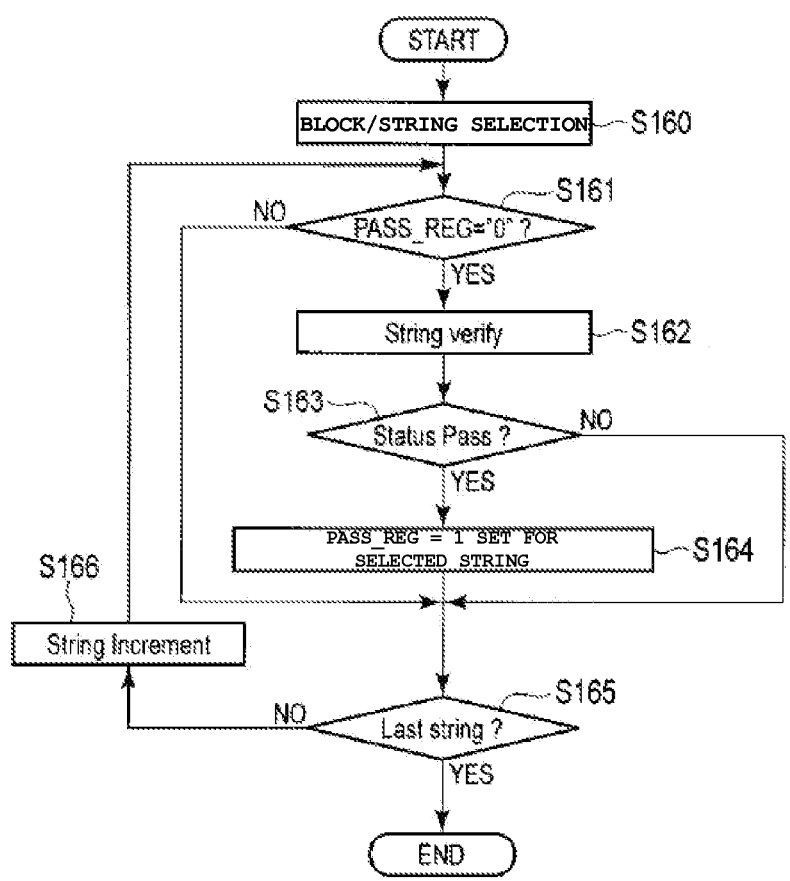
FIG. 30 is a flow chart showing the erase method of the fourth embodiment.

Next, details of the second erase method will be explained with reference to FIG. 29 and FIG. 30. FIG. 29 is a flow chart showing a flow of the entire process of the second erase method, and FIG. 30 is a flow chart showing the details of the erase verify in particular. The following process is implemented under the initiative of the sequencer in response to the reception of an erase command from the controller.

As shown in FIG. 29, first, any of the strings (string groups GP) of any of the blocks BLK is selected (step S140). Next, a bad string sense is applied (step S141). In other words, the read operation explained with reference to FIG. 8 to FIG. 12 in the first embodiment is implemented. As a result of the step S141, if all of the bit lines BL are "0" (step S142), that is, if the selected string is a bad string, "1" is set in a register (PASS_REG) installed for each string (step S145). The register PASS_REG is a register for holding information regarding whether or not the erase verify has passed. In this case, "1" is set before implementing the erase verify. This process is carried out for all the strings in the block BLK to be erased (steps S143 and S144).

After the processes of steps S141 and S145 are implemented for all of the strings, all of the registers PASS_REG are checked. If "1" is set in all of the registers PASS_REG (step S146, YES), all of the strings of the block BLK to be erased are bad strings. Therefore, the NAND-type flash memory 1 informs the controller of the erase failure. In this case, future access prohibition on the block is notified by returning a status file to the controller. Thereafter, the controller manages this block as a bad block.

If "0" is set in any of the registers PASS_REG (step S146, NO), data in the block BLK to be erased are collectively erased (step S147).

After the data erase, the erase verify is carried out (step S148). As a result of the erase verify (step S149, YES), if all of the registers PASS_REG are set to "1" (step S149, YES), the erase operation is completed. On the other hand, if any of the registers PASS_REG is set to "0" (step S149, NO) and the erase loop times does not reach its upper limit (step S150, NO), the flow returns to step S147, and the data erase and the erase verify steps are repeated.

At step S150, if the erase loop times reaches its upper limit (step S150, YES), the erase fails. At that time, the NAND-type flash memory 1 sets "1" in a status register installed for each string to inform the controller that the string is a bad string. Here, the bad string, which has been noted, is a string that has been decided to be a normal string in the test sequence explained in the second embodiment and has been deemed to be defective after the test. Therefore, the controller may additionally note the bad string information in the second ROM fuse, or the controller itself may also manage the information.

In case such a bad string information added after the test is found, the controller, as explained in the first embodiment, writes the bad string information into the corresponding selective transistors ST1 and ST2 or the back gate transistor BT. Next, this bad string information is written into any of the areas of the NAND-type flash memory 1. This area, as previously described, may be an area in the second ROM fuse or may also be an area different from the second ROM fuse. However, the control may also hold the information in its internal RAM, and the like, without writing the information into the NAND-type flash memory 1.

Next, details of the erase verify of the step S148 will be explained with reference to FIG. 30. As shown in the figure, any of the strings (string groups GP) in the block BLK, from which data have been erased, is selected (step S160). Then, for example, the sequencer confirms the register PASS_REG corresponding to the selected string (step S161).

If the register PASS_REG is "1" (step S161, NO), the string has already been passed through the erase verify. Therefore, the sequencer decides whether or not the string is the last string in the block BLK from which the data have been erased (step S165). If the string is the last string (step S165, YES), the erase verify is completed. If the string is not the last string (step S165, NO), the sequencer selects the next string (step S166) and returns to step S161.

At step S161, if the register PASS_REG corresponding to the selected string is "0," the sequencer carries out the erase verify at a string unit (step S162). In other words, the read operation of the data is implemented for only the selected string. If the erase verify is passed (step S163, YES), that is, all of the bit lines BL are "1," the threshold of the memory cell transistors MT in the string is lower than the verify level VEVFY. Therefore, the sequencer sets "1" in the register PASS_REG (step S164) and advances to the step S165. If the erase verify is skipped (step S163, NO), step S164 is omitted, and the flow proceeds to the step S165.

4.3 Effect of this Embodiment

Figure 31:
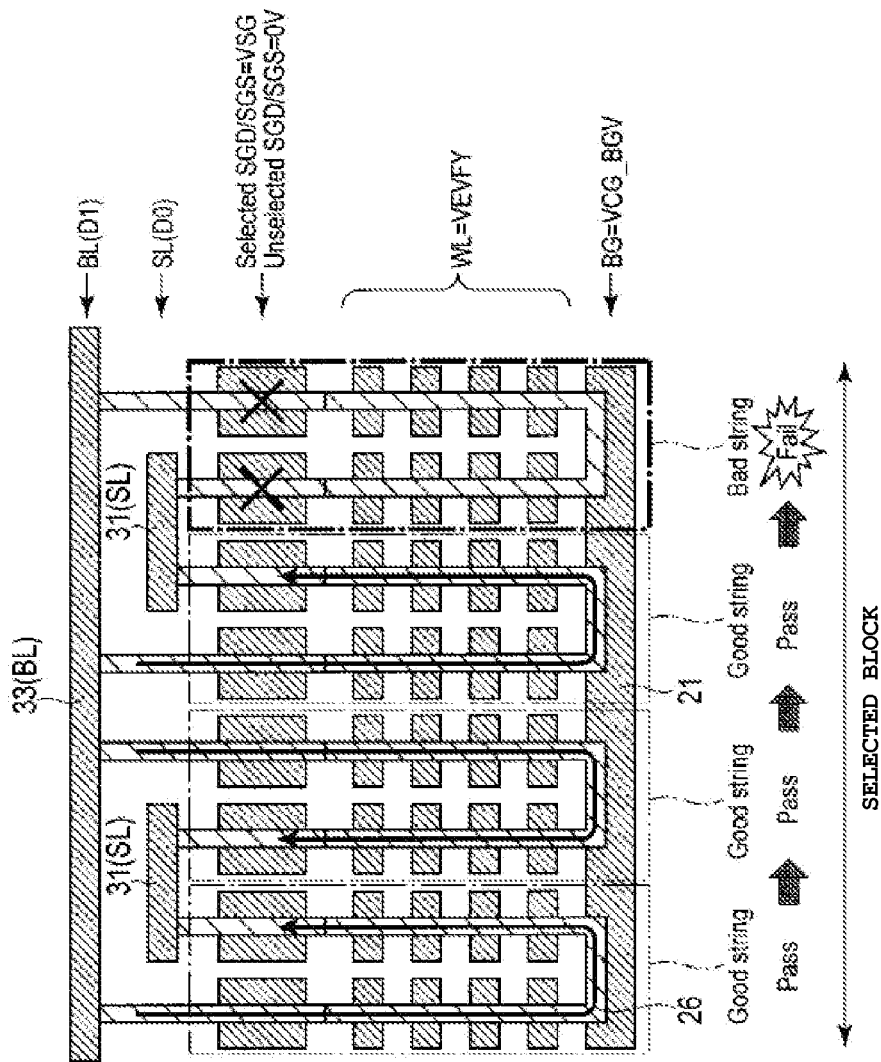
FIG. 31 is a circuit diagram showing the memory cell array of the fourth embodiment.

According to the method of this embodiment, the reliability of the erase operation can be improved. This effect will be explained below with reference to FIG. 31. FIG. 31 is a cross section showing the block BLK along the bit line direction and shows an erase verify state at a string unit.

As shown in the figure, in case the erase verify is carried out at a string unit, if the bad string mode BSM is applied, the erase verify on a bad string always fails. The reason for this is that, even if the threshold of the memory cell transistors MT1 and MT2 is sufficiently low, the selective transistors ST1 and ST2 or the back gate transistor BT is in an off state. Therefore, even if the erase of the other normal string is successful, there is a possibility that it is decided that the erase operation of the block BLK fails.

From such a viewpoint, according to this embodiment, whether or not a bad string is included in the erased block BLK is detected in advance. Next, as for the bad string, "1" is set in the register PASS_REG without the erase verify. In other words, information showing that the erase verify is passed is written in advance.

As a result, since the bad string always passes through the erase verify, the BSM can be prevented from having a negative influence on the erase operation.

5. Fifth Embodiment

Next, the semiconductor memory device of the fifth embodiment will be explained. Unlike the second and the third embodiments, this embodiment relates a method that does not write bad string information into the second ROM fuse but that, rather, writes the information in the row decoder 11 and manages a bad string by the NAND-type flash memory 1 instead of the controller. In the following, only the elements that are different from the first to the fourth embodiments will be explained.

5.1 Block Decoder 40

First, the block decoder 40 will be explained.

5.1.1 Constitution of Block Decoder 40

Figure 32:
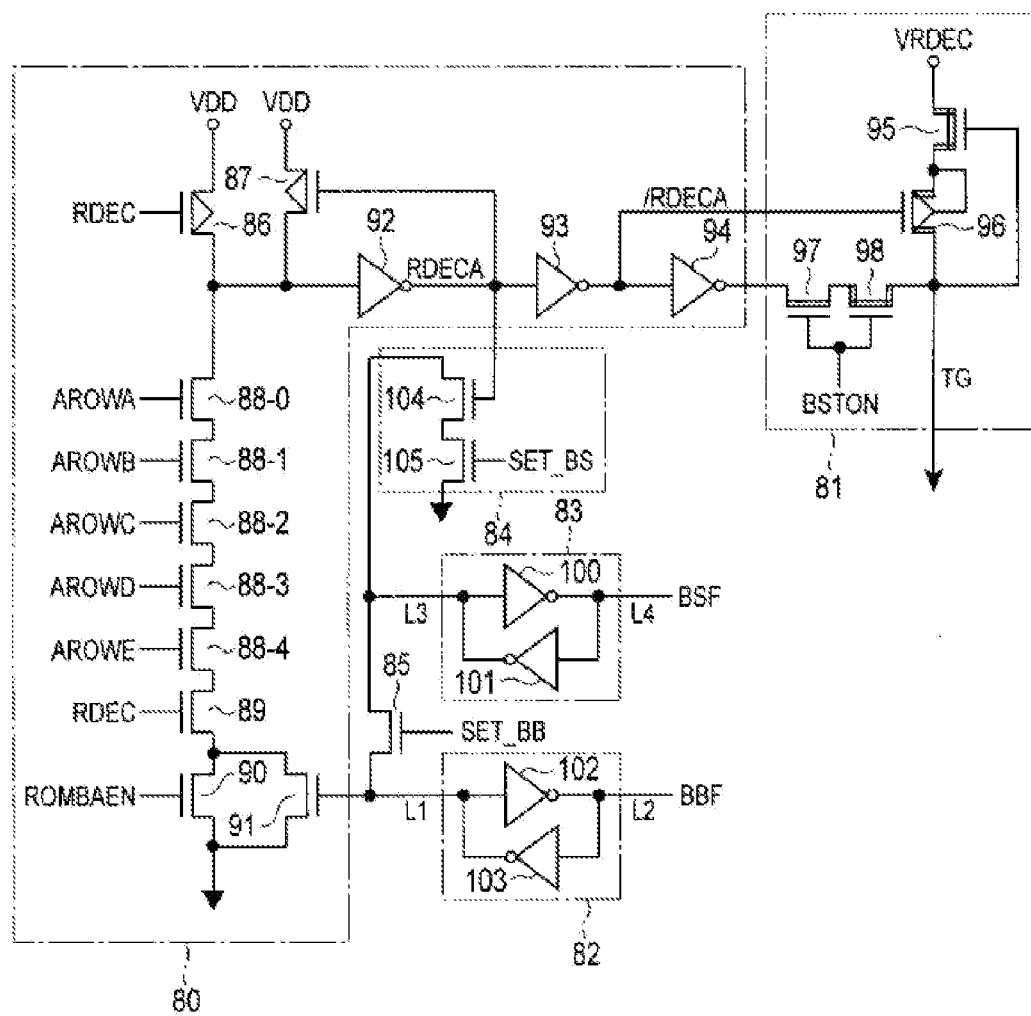
FIG. 32 is a circuit section showing a block decoder of a fifth embodiment.

FIG. 32 is a circuit section showing the block decoder 40 of this embodiment. As shown in the figure, the block decoder 40 is mainly provided with decoding circuit 80, level shift 81, first holding circuit 82, second holding circuit 83, first setting circuit 84, and second setting circuit 85.

The decoding circuit 80 includes low-breakdown voltage, enhancement-type p-channel MOS transistors 86 and 87; low-breakdown voltage, enhancement-type n-channel MOS transistors 88-0 to 88-4 and 89-81; and inverters 92-94.

In the MOS transistors 86 and 87, the power supply potential VDD is applied to their sources, their drains are commonly connected, and a signal RDEC is transmitted to the gate of the MOS transistor 86. The sources of the MOS transistors 90 and 91 are grounded, their drains are commonly connected, and a signal ROMBAEN is transmitted to the gate of the MOS transistor 90. Usually, the signal ROMBAEN is constantly at the "L" level. The current paths of the MOS transistors 88-0 to 88-4 and 89 are sequentially connected in series between the drains of the MOS transistors 86 and 87 and the drains of the MOS transistors 90 and 91. In addition, signals ARROWA to ARROWE and RDEC are input into each gate. In case the block decoder 40 corresponds to a selective block, all of the signals ARROWA to ARROWE are at the "H" level; if the block decoder does not correspond to the selective block, at least one of the signals is at the "L" level. In case the signal RDEC is input into the signals ARROWA to ARROWE, the signal is at the "H" level. The inverters 92 to 94 are connected in series, and an input node of the inverter 92 is connected to the sources of the MOS transistors 86 and 87 and the drains of the MOS transistor 88-0. An output node of the inverter 92 and an input node of the inverter 93 are connected to the gate of the MOS transistor 87. Moreover, an output of the inverter 93 is the signal/RDECA.

Next, the level shift 81 will be explained. The level shift 81 includes MOS transistors 95 to 98.

The MOS transistor 97 is a low-breakdown, voltage depletion-type n-channel MOS transistor; its drain is connected to an output node of the inverter 94; and a signal BSTON is transmitted to its gate. When a block address is decoded, the signal BSTON is turned to the "H" level. The MOS transistor 98 is a high-breakdown, voltage depletion-type n-channel MOS transistor, as compared with the MOS transistor 97. The drain of the MOS transistor 98 is connected to the source of the MOS transistor 97, and the signal BSTON is transmitted to its gate. The MOS transistor 96 is a high-breakdown, voltage enhancement-type p-channel MOS transistor. The drain of the MOS transistor 96 is connected to the source of the transistor 98; its source is connected to the back gate; and the signal/RDECA is input into its gate. The MOS transistor 95 is a high-breakdown, voltage depletion-type n-channel MOS transistor. The voltage VRDEC is applied to the drain of the MOS transistor 95; its source is connected to the transistor 96; and its gate is connected to the source of the transistor 98 and the drain of the transistor 96. When data are written, read out, and erased, the voltage VRDEC is set to a necessary value. More specifically, as shown in FIG. 5 in the first embodiment, the voltage is set to the VPGMH at the time of the write operation; the voltage is set to the VREADH at the time of the read operation; and the voltage is set to the Vdda at the time of the erase operation.

Next, the potential at a common connection node of the source of the transistor 98, the drain of the transistor 96, and the gate of the transistor 95 is applied as the signal TG to the gates of the corresponding transistors 50, 51, 53, and 55; additionally, the signal/RDECA is transmitted to the gates of the corresponding transistors 52 and 54.

Next, the first holding circuit 82 will be explained. The first holding circuit 82 is a latch circuit provided with inverters 102 and 103. An input node of the inverter 102 and an output node of the inverter 103 are connected to a node L1, and an input node of the inverter 103 and an output node of the inverter 102 are connected to a node L2.

The node L1 is connected to the gate of the MOS transistor 91.

Next, the first holding circuit 82 holds the bad block flag BBF. In other words, in case the corresponding block BLK is a bad block, the node L2 is turned to the "H" level by the controller, and the node L1 is turned to the "L" level. Since the BBF is set in this manner, the transistor 91 is always in an off state.

Next, the second holding circuit 83 will be explained. The second holding circuit 83 is a latch circuit provided with inverters 100 and 101. An input node of the inverter 100 and an output node of the inverter 101 are connected to a node L3, and an input node of the inverter 101 and an output node of the inverter 100 are connected to a node L4.

Then, the second holding circuit 83 holds the bad string flag BSF. In other words, in case at least one of the strings of the corresponding block BLK is a bad string, the node L4 is turned to the "H" level by the controller, and the node L3 is turned to the "L" level.

Next, the first setting circuit 84 will be explained. The first setting circuit 84 is a circuit for writing the bad block flag BBF and the bad string flag BSF into the first and second holding circuits 82 and 83. The first setting circuit 84 includes n-channel MOS transistors 104 and 105. The source of the transistor 105 is grounded, its drain is connected to the source of the transistor 104, and a signal SET_BS is input into its gate. The signal SET_BS is turned to the "H" level when the bad block flag BBF or the bad string flag BSF is written. The drain of the transistor 104 is connected to the node L3, and the signal RDECA is input into its gate.

Next, the second setting circuit 85 will be explained. The second setting circuit 85 is a circuit for writing the bad block flag BBF into the first holding circuit 82, for example, n-channel MOS transistor 85. The source of the transistor 85 is connected to the node L1, its drain is connected to the node L3, and a signal SET_BB is input into its gate. The signal SET_BB is turned to the "H" level when the bad block flag is written.

5.1.2 Write Method of BBF and BSF

Next, a method for writing the bad block flag BBF and the bad string flag BSF into the block decoder 40 with the constitution will be explained.

First, the method for writing the bad block flag BBF will be explained. The timing of the write operation of the bad block flag BBF into the holding circuit 82, for example, is the test time shown in FIG. 17 and the power input time shown in FIG. 26.

First, the controller inputs the block address of a defective block BLK into the NAND-type flash memory 1. As a result, in the block decoder 40 corresponding to the defective block BLK, all of the signals AROWA to AROWE are turned to the "H" level. In addition, the signal RDEC is also turned to the "H" level. The signal ROMBAEN is at the "L" level as previously explained. Moreover, since the holding circuit 82 is in a state in which the BBF is not yet written, the node L1 is at the "H" level. Therefore, the signal RDECA is turned to the "H" level.

Furthermore, the controller sets the signal SET_BS and the signal SET_BB to the "H" level. Therefore, the transistors 104, 105, and 85 are set to an on state, the node L1 is turned to the "L" level, and the node L2 is turned to the "H" level. As a result, the BBF is set.

Next, a method for writing the bad string flag BSF will be explained. Similar to the bad block flag BBF, the timing of the write operation of the bad string flag BSF into the hold circuit 83, for example, is the test time shown in FIG. 17 and the power input time shown in FIG. 26.

First, the controller inputs the block address of the block BLK containing a bad string into the NAND-type flash memory 1. As a result, similar to the timing of the write operation of the bad block flag BBF, the signal RDECA is turned to the "H" level in the corresponding block decoder 40.

Next, the controller sets the signal SET_BS to the "H" level. In case the bad block flag BBF is not written, the signal SET_BB is turned to the "L" level. Therefore, the transistors 104 and 105 are set to an on state, the node L3 is turned to the "L" level, and the node L4 is turned to the "H" level. As a result, the BSF is set.

5.1.3 Operation of Block Decoder 40

Next, the operation of the block decoder 40 at a time of data access will be explained.

First, the case where the bad block flag BBF is not set will be explained. In case the corresponding block BLK is matched to the block address, all of the signals AROWA to AROWE are turned to the "H" level. In addition, the signal RDEC is also turned to the "H" level. The node L1 is at the "H" level. Therefore, the transistors 88, 89, and 91 are set to an on state, the signal RDECA is at the "H" level, and the signal /RDECA is at the "L" level. Here, the signals SET_BS and SET_BB are turned to the "L" level.

In the level shift 81, the signal BSTON is turned to the "H" level. Therefore, the transistors 97 and 98 are set to an on state, and the signal TG is turned to the "H" level. In addition, since the signal /RDECA is at the "L" level, the transistor 96 is also set to an on state, so that the transistor 95 is also set to an on state.

Therefore, the voltage VRDEC is output as the signal TG via the current paths of the transistors 95 and 96. As a result, the transistors 50, 51, 53, and 55 with referring to FIG. 5 are set to an on state.

In case the bad block flag BBF is set, the transistors 88 and 89 are in an on state, however the transistor 91 is in an off state. Therefore, since the signal RDECA is at the "L" level, the transistors 95 and 96 are also set to an off state, so that the signal TG is turned to the "L" level. As a result, the transistors 50, 51, 53, and 55 shown in FIG. 5 are set to an off state. On the contrary, since the signal /RDECA is turned to the "H" level, the transistors 52 and 54 are set to an on state.

In case the corresponding block BLK is not matched with the block address, any of the signals AROWA to AROWE is turned to the "L" level, so that the signal RDECA is at the "L" level. Therefore, similar to the case in which the bad block flag BBF is set, the TG is at the "L" level.

Here, the bad string flag BSF itself has no influence on the operation of the block decoder 40.

5.2 Operation of NAND-Type Flash Memory 1

Figure 33:
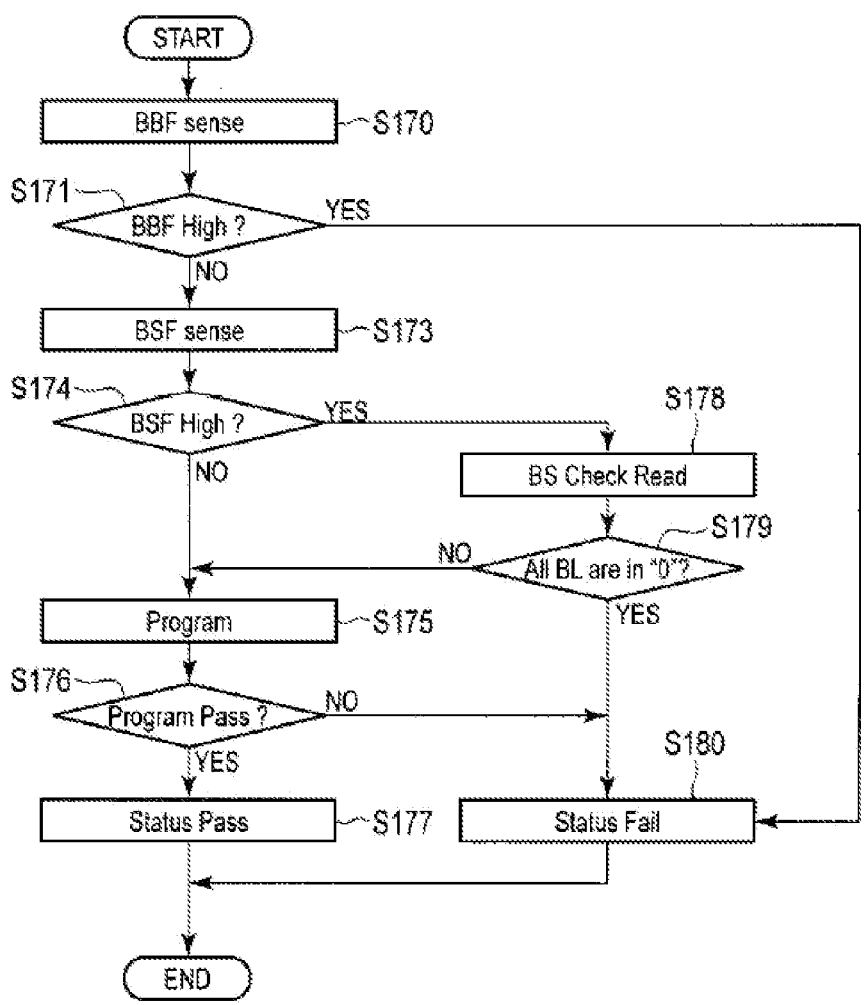
FIG. 33 is a flow chart showing a write method of the fifth embodiment.

Next, when there is a data access request from the controller, the operation of the NAND-type flash memory 1 will be explained with reference to FIG. 33. FIG. 33 shows a processing flow of the NAND-type flash memory when a data write request is received. In the following, the operation at the time of a write request will be explained as an example; however, the operation is similar to the operation performed at the time of a read request.

As shown in the figure, if a write request is received from the controller, for example, the sequencer applies a bad block sense (step S170). In other words, in the block decoder 40 corresponding to the received block address, whether or not the bad block flag BBF is set in the holding circuit 82 is confirmed.

If the bad block flag BBF is set (step S171, YES), the sequencer returns a status fail to the controller without implementing the required write operation (step S180).

If the bad block flag BBF is not set (step S171, NO), the sequencer applies a bad string flag sense (step S173). In other words, whether or not the bad string flag BSF is set in the holding circuit 83 is confirmed in the block decoder 40 corresponding to the received block address.

If the bad string flag BSF is not set (step S174, NO), the sequencer implements a program of data received from the controller (step S175). In case there is a read request, data are read out. Next, if the program is successful (step S176, YES), such a status is returned to the controller (step S177); if the program is not successful (step S176, NO), a status fail is returned to the controller (step S180).

At step S173, in case the bad string flag BSF is set (step S174, YES), the sequencer applies a bad string sense (step S178). In other words, the data read out shown in FIG. 8 to FIG. 12 is carried out for the string corresponding to the address received from the controller. If the string is not a bad string, all of the bit lines BL are "1" (corresponding to the case of FIG. 9 and FIG. 10). In this case (step S179, NO), the sequencer advances to step S175 and programs the data. On the other hand, if the string is a bad string, all of the bit lines BL are "0" (corresponding to the case of FIG. 11 to FIG. 12). In this case (step S179, YES), the sequencer advances to step S180 and returns a status fail to the controller.

5.3 Effect of this Embodiment

According to the constitution of this embodiment, the second ROM fuse area explained in the third embodiment is erased or is unnecessary, and the process of starting the NAND-type flash memory 1 can be sped up. This effect will be explained below.

In this embodiment, each of the block decoders 40 holds the bad string flag BSF. The bad string flag BSF means that the corresponding block BLK includes a bad string (having no information on which string is a bad string).

Next, when there is an access request from the controller, the NAND-type flash memory 1 itself checks the bad string flag BSF. If the BSF is set, whether or not the string to be accessed is a bad string is confirmed by a bad string sense. In other words, the existence of a bad string is decided by a bad string flag sense (step S173), and if there is a bad string, the bad string is specified by the bad string sense (step S178).

Therefore, according to this embodiment, a bad string can be managed by the NAND-type flash memory 1, and the control of the controller is not required. Therefore, it is unnecessary to write bad string information into the second ROM fuse. As a result, when power is input, it is unnecessary to read the bad string information out of the second ROM fuse, thus making it possible to start the NAND-type flash memory 1 at high speed.

Here, like the third embodiment, in case the controller controls bad string information, it is necessary to read the bad string information out of the second ROM fuse when power is input; however, the second holding circuit 83 in the block decoder 40 is not required, and the size of the row decoder 11 can be reduced. In addition, each time the data area is accessed, the bad string sense (step S178) is also unnecessary.

Therefore, in response to the request on a product, the constitution of the third embodiment and the constitution of the fifth embodiment can be appropriately selected.

6. Sixth Embodiment

Next, the semiconductor memory device of the sixth embodiment will be explained. This embodiment relates to a method for confirming whether or not the NAND-type flash memory 1 adopts the bad string mode (BSM) method explained in the first to the fifth embodiments. In the following, only the elements that are different from the first to the fifth embodiments will be explained.

6.1 First Method

Figure 34:
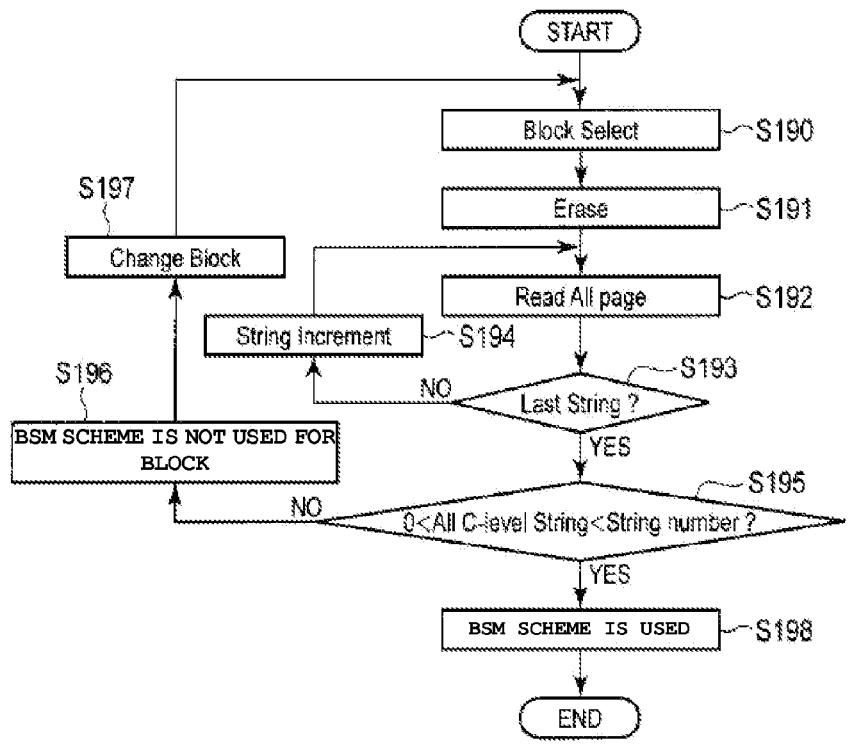
FIG. 34 is a flow chart showing a decision method of a sixth embodiment.

A first method for confirming whether or not the BSM method is adopted will be explained. FIG. 34 is a flow chart showing the first method. For example, this process is executed by a sequencer in response to an instruction of a controller.

First, any of the blocks BLK is selected (step S190), and all data in the selected block BLK are erased (step S191). Next, in the selected block BLK, all page data are read out of each string (step S192). This readout is the same as that explained with reference to FIG. 8 to FIG. 12 in the first embodiment. This readout is repeated through all of the strings (step S193, NO, S194). Each time the readout is repeated, the number of strings in which all of the bit lines BL are "0" (that is, the number of strings in which the read data are at the "C" level for all the columns) is counted.

Next, after the readout from all of the strings is finished (step S193, YES), if the number of strings in which the read data have been at the "C" level for all the columns is greater than 0 and smaller than the total number of strings in the block (step S195, YES), the sequencer decides that the BSM is employed (step S198).

On the other hand, if the number of strings in which the read data have been at the "C" level for all the columns is zero or all the strings are at the "C" level (step S195, NO), the sequencer decides that the BSM is not employed for at least the block BLK (step S196), selects the next block BLK (steps S197 and S190), and repeats the process from step S191.

Figure 35:
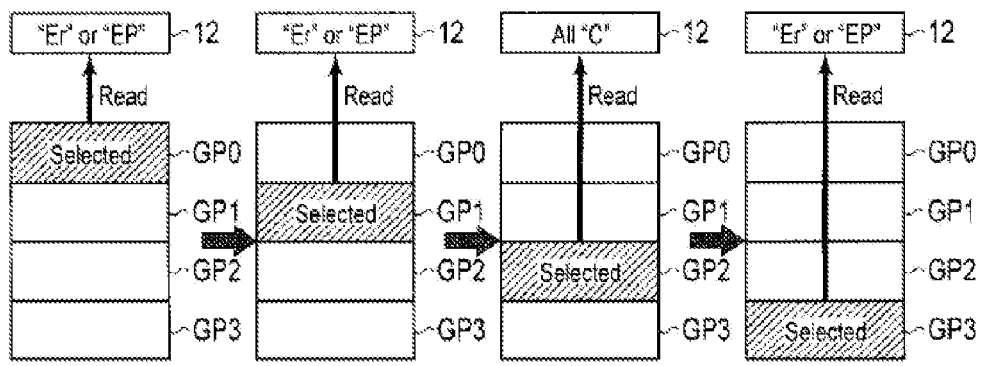
FIG. 35 is a conceptual diagram showing the decision method of the sixth embodiment.

A detailed example of the process is shown in FIG. 35. FIG. 35 is a schematic diagram illustrating a certain block BLK and the sense amplifier 12 and shows a state (step S192) in which data are sequentially read out of each string after the erase of the selected block BLK (step S191).

As shown in the figure, when data are read out of the string group GP0, it is assumed that the read data have been at the Er level or EP level for all of the columns. The read of data out of the next string group GP1 is also similar. Next, when data are read out of the string group GP2, it is assumed that the read data have been at the C level for all of the columns. The last string group GP3 is at the Er level or EP level.

In this case, the number of strings in which the read data have been at the C level for all the columns is 1 and is smaller than the total number 4 of strings. Therefore, it is decided that the NAND-type flash memory 1 employs the BSM.

The reason why the case where all of the strings are bad strings is excluded is that it is difficult to discriminate it from the case where the corresponding block BLK is processed as a bad block. Therefore, it can be decided that the BSM is adopted for the case where strings in which all of the memory cell transistors MT are at the erase level (the Er level or EP level) and strings in which all of the memory cell transistors MT are at the C level are mixed in one block.

6.2 Second Method

Figure 36:
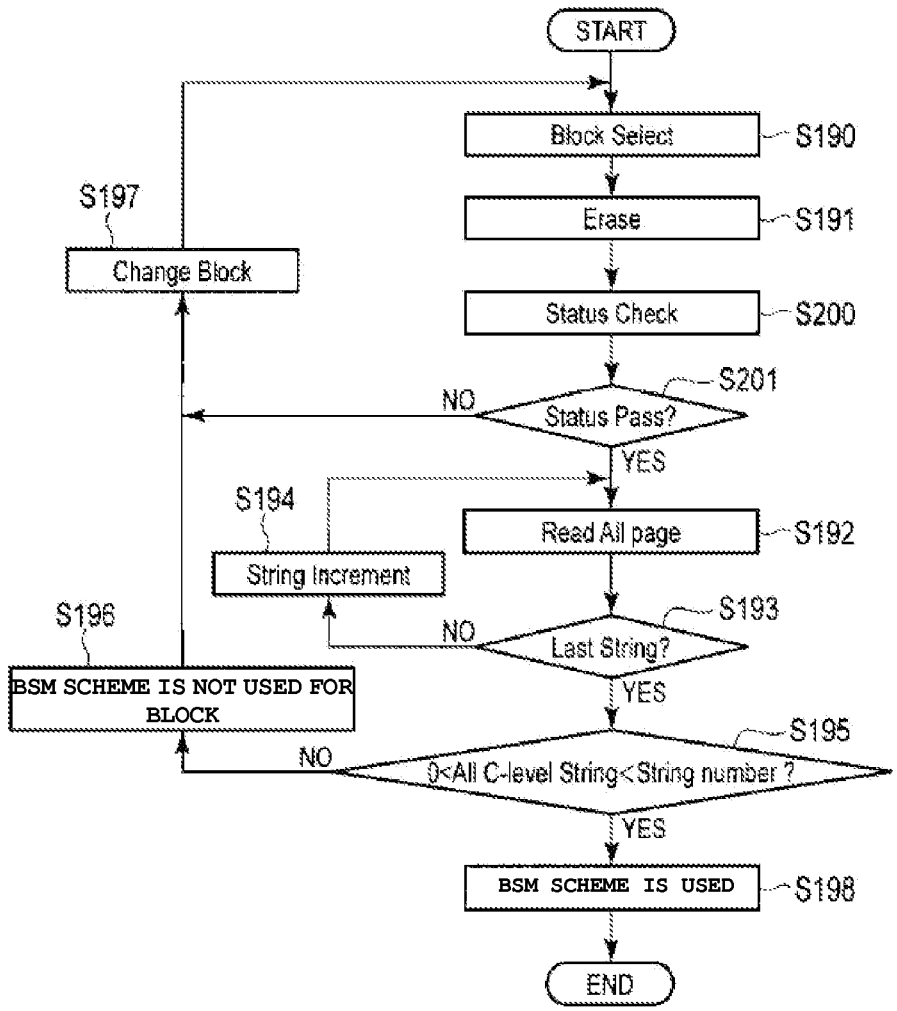
FIG. 36 is a flow chart showing the decision method of the sixth embodiment.

Next, a second method will be explained with reference to FIG. 36. FIG. 36 is a flow chart showing the second method.

As shown in the figure, the second method is the following modification of the first method. In other words, (1) After erasing, the status is checked (step S200). Here, the erase verify employs the second method (verify for each string) as explained in the fourth embodiment.

(2) As a result of the status check, if the status is a status pass (that is, the case where the erase is successful: step S201, YES), the process proceeds to step S192; if the status is a status fail (that is, the case where the erase fails: step S201, NO), the next block is selected (step S197).

At step S200, as the relationship between the state of the selected block BLK and the status, the following cases are considered. In other words, (a) The case where all the strings in the selected block are bad strings: fail (b) The case where the selected block is a bad block: fail (c) The case where at least one of the strings in the selected block is a bad string: pass (d) The case where the selected block includes intrinsic erase defect, wherein the intrinsic erase defect is an erase defect for a reason other than (a) and (b), for example a subsequent erase defect: fail (e) The case where the selected block includes no bad strings: pass Therefore, only the case of the status pass is subjected to the processing from step S192, thus making it possible to improve the processing efficiency.

6.3 Third Method

Figure 37:
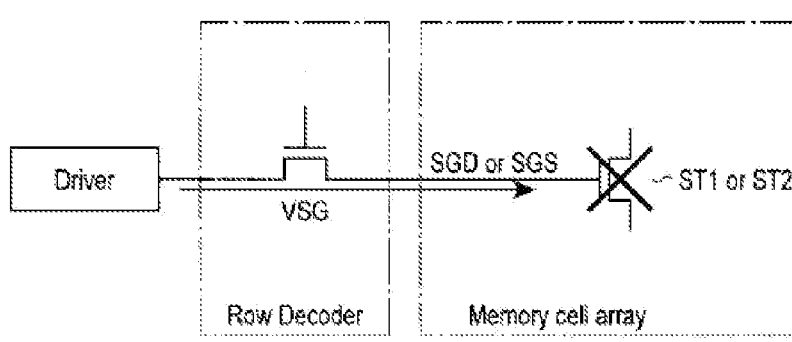
FIG. 37 is a schematic diagram showing the driver, row decoder, and memory cell array of the sixth embodiment.

Next, a third method will be explained. FIG. 37 is a schematic diagram showing the BSM of the first to the fifth embodiments.

As shown in the figure, in the BSM of the embodiments, the row decoder 11 corresponding to a selected block BLK transfers the voltage VSG to the selective gate lines SGD and SGS (or transfers the voltage VCG_BGV to the back gate line BG). In addition, the threshold of the selective transistors ST1 and ST2 (or the back gate transistor BT) is set so that it is higher than an ordinary value, prohibiting a bad string from being selected.

Figure 38:
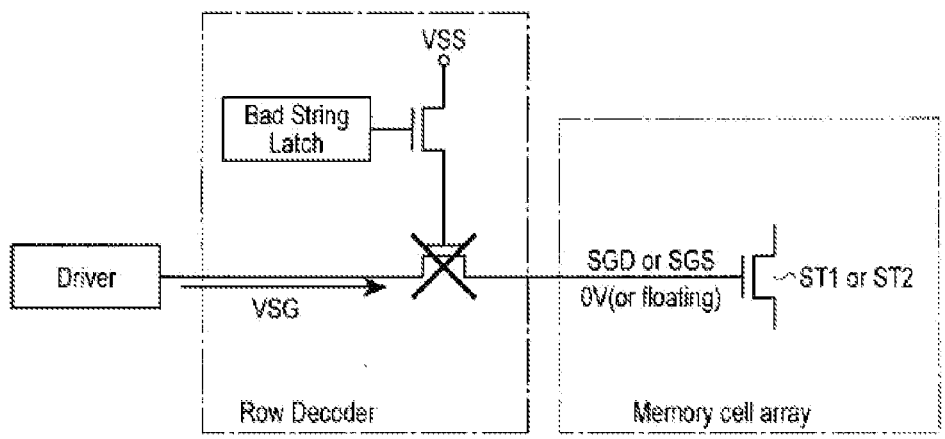
FIG. 38 is a flow chart showing the driver, row decoder, and memory cell.

On the contrary, as the method for managing a defect at a string unit, a method shown in FIG. 38 is also considered. This method holds bad string information in the row decoder to prohibit a voltage transfer operation of the row decoder in accordance with this information. Therefore, according to this method, without transferring the voltage VSG (or VCG_BGV) to the selective gate lines SGD and SGS (or the back gate line BG) corresponding to a bad string, a voltage (for example, 0 V) for turning off the selective transistors ST1 and ST2 is applied, or these transistors are electrically floated.

Figure 39:
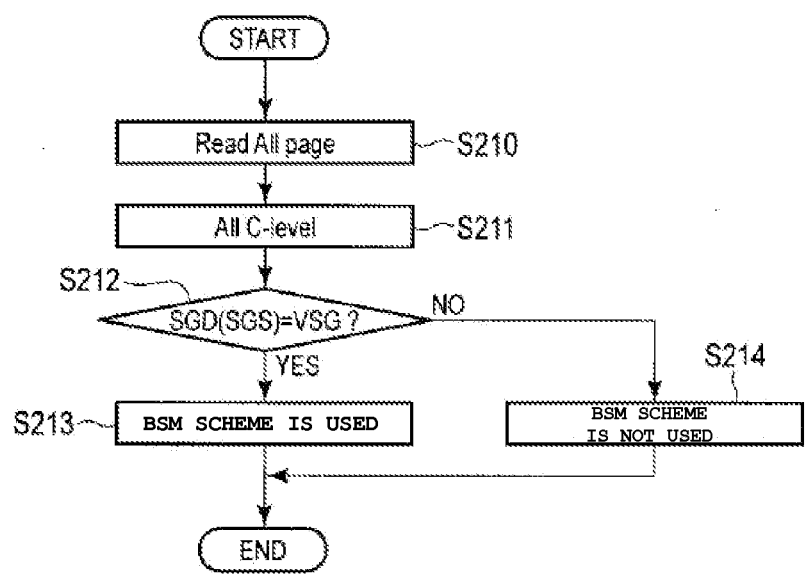
FIG. 39 is a flow chart showing the decision method of the sixth embodiment.

In consideration of this point, a method shown in FIG. 39 can be employed. FIG. 39 is a flow chart showing the third method.

As shown in the figure, any of the strings is selected, and all page data are read out of the string (step S210). This readout is the same as the process that has been explained with reference to FIG. 8 to FIG. 12 in the first embodiment. Next, if the read data are at the "C" level for all of the columns, whether or not the potential of the selective gate lines SGD and/or SGS are the VSG is confirmed (step S212). If the VSG is applied to the selective gate lines SGD and SGS (step S212, YES), it can be decided that the bad string mode BSM explained in the embodiments is employed (step S213). On the other hand, if the VSG is not applied (step S212, NO), it can be decided that the BSM explained in the embodiments is not employed (step S214).

6.4 Fourth Method

Figure 40:
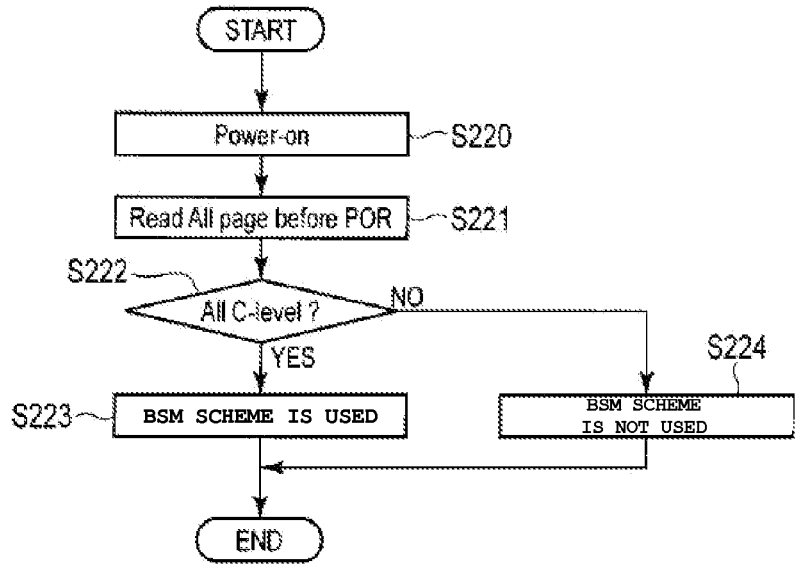
FIG. 40 is a flow chart showing the decision method of the sixth embodiment.

Next, a fourth method will be explained. According to the method explained in FIG. 38, the timing of the write operation of bad string information into the row decoder is generally right after power input (it is called POR: power-on read). In other words, a defect at a string unit can be managed after the POR. It is the fourth method that utilizes this characteristic. FIG. 40 is a flow chart showing the fourth method.

As shown in the figure, a power is input into the NAND-type flash memory 1 (step S220). Therefore, the controller selects any of the strings before information is read out of the ROM fuse by the POR (sometimes before the read out of the second ROM fuse), and all page data are read out of the string (step S221). This readout is the same as the process that has been explained with reference to FIG. 8 to FIG. 12 in the first embodiment. Next, if the read data are at the "C" level for all of the columns in any of the strings, it is decided that the BSM explained in the embodiments is employed (step S223). On the other hand, if there is no string in which the read data are at the "C" level for all of the columns, it can be decided that the BSM explained in the embodiments is not employed (step S224).

7. Seventh Embodiment

Next, the semiconductor memory device of the seventh embodiment will be explained. This embodiment relates to the controller of the NAND-type flash memory 1 explained in the first embodiment to the sixth embodiment.

Figure 41:
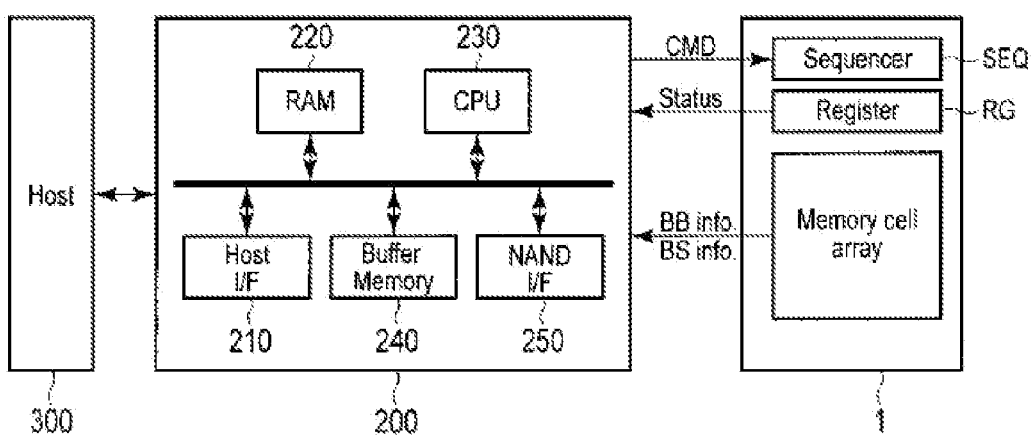
FIG. 41 is a block diagram showing a memory system of a seventh embodiment.

FIG. 41 is a block diagram showing a memory system of this embodiment. As shown in the figure, the memory system is provided with host appliance 300, controller 200, and NAND-type flash memory 1.

The controller 200 issues the read, write, and erase instructions to the NAND-type flash memory 1 in response to instructions from the host appliance 300. In addition, the controller controls the memory space of the NAND-type flash memory 1. The controller 200 and the NAND-type flash memory 1, for example, may constitute the same semiconductor device. Memory cards such as SD™ card, SSD (solid state drive), and the like, are examples.

The controller 200 includes host interface circuit 210, built-in memory 220, processor (CPU) 230, buffer memory 240, and NAND interface circuit 250.

The host interface circuit 210 is connected to the host appliance 300 via a host interface and is in charge of communications with the host appliance 300. In addition, the host interface circuit transfers instructions and data received from the host appliance 300 to the CPU 230 and the buffer memory 240, respectively. Moreover, the host interface circuit transfers data in the buffer memory 240 to the host appliance 300 in response to the instructions of the CPU 230.

The NAND interface circuit 250 is connected to the NAND-type flash memory 1 via an NAND interface and is in charge of communications with the NAND-type flash memory 1. In addition, this interface circuit transfers the instructions received from the CPU 230 to the NAND-type flash memory 1 and transfers write data in the buffer memory 240 to the NAND-type flash memory 1 at a time of the write operation. Moreover, at the time of the read operation, this interface circuit transfers the data read out of the NAND-type flash memory 1 to the buffer memory 240.

The CPU 230 controls the entire operation of the controller 200. For example, in case a readout instruction is received from the host appliance 300, a readout instruction based on the NAND interface is issued in response to the instruction reception. Write and erase operations are similarly carried out. In addition, the CPU 230 implements various processes, such as ware leveling, for managing the NAND-type flash memory 1. Moreover, the CPU 230 implements various kinds of arithmetic operations. For example, encoding the processing of data, randomizing the processing, performing error correction of the processing, and the like, are implemented.

The built-in memory 220, for example, is a semiconductor memory such as DRAM and is used as a work area of the CPU 230. In addition, the built-in memory 220 holds firmware or various kinds of management tables for managing the NAND-type flash memory.

In the constitution, if the NAND-type flash memory 1 is started, data (for example, bad block information) read from the ROM fuse, for example, are stored in the RAM 220 via the NAND interface circuit 250. Next, the CPU 230 instructs the NAND-type flash memory 1 to read the second ROM fuse via the NAND interface circuit 250. This instruction is issued to the sequencer SEQ of the NAND-type flash memory 1. In response to this instruction, data (for example, bad string information) in the second ROM fuse are read and stored, for example, in the RAM 220 via the NAND interface circuit 250. Therefore, the controller 200 recognizes a bad block and a bad string in the NAND-type flash memory 1 and can prevent these areas from being accessed. Even if these areas are accessed, since the data, which are read out of the NAND-type flash memory, are data (data at the "C" level corresponding to the "0" state for all of the bit lines, it can be recognized that the accessed area is defective.

In addition, the NAND-type flash memory 1 has various kinds of registers RG. The controller 200 can detect the status of the NAND-type flash memory 1 by the states of these registers.

Here, the tester explained in the second embodiment may also have a constitution similar to that of the controller 200. In addition, the processing shown in FIG. 16 to FIG. 21 can be implemented under the initiative of the CPU 230.

8. Modified Examples

As previously explained, the semiconductor memory device 1 is provided with the first and second selective transistors ST1 and ST2, which include a charge storage layer and a control gate, and several memory cell transistors MT, which respectively include a charge storage layer and a control gate and are connected in series between the first and second selective transistors. In addition, in case any of the memory cell transistors is defective, the defect information is written into at least any of the first and second selective transistors ST1 and ST2 (step S12 of FIG. 6). Alternately, the defect information is written into the back gate transistor BT.

With this constitution, defect management information at the granularity of a string unit can be stored in the selective transistors ST1 and ST2 or the back gate transistor BT and can be transferred to the controller. In addition, even in case the control accesses a bad string, since the selective transistors ST1 and ST2 or the back gate transistor BT is in an off state, all of the bit lines BL are in the "0" state. Therefore, the controller can recognize that the accessed string is a bad string.

As a result, with the management of a defect at the granularity of a string unit, many more memory cells can rescued, thus making it possible to improve the utilization efficiency of the semiconductor memory device 1. However, the embodiment is not limited to the embodiments described herein and can be variously modified.

For example, in case bad string information is written into a selective transistor, this information may be written into only one selective transistor instead of both of the selective transistors ST1 and ST2. The reason for this that, if at least one of these selective transistors is set to an off state, the cell current Icell does not flow. However, in consideration of an operation with higher reliability, it is desirable to write the bad string information into both of the selective transistors ST1 and ST2. In addition, the bad string information may be written into the selective transistors ST1 and ST2 and the back gate transistor BT, instead of one of them.

The case where the controller 200 accesses a bad string, the NAND-type flash memory 1 returns information showing that all of the cells are in an off state (data corresponding to all of the bit lines BL in the "0" state) to the controller 200, has been explained as an example. However, in this case, the NAND-type flash memory 1 may also return the status fail to the controller 200.

Figure 42:
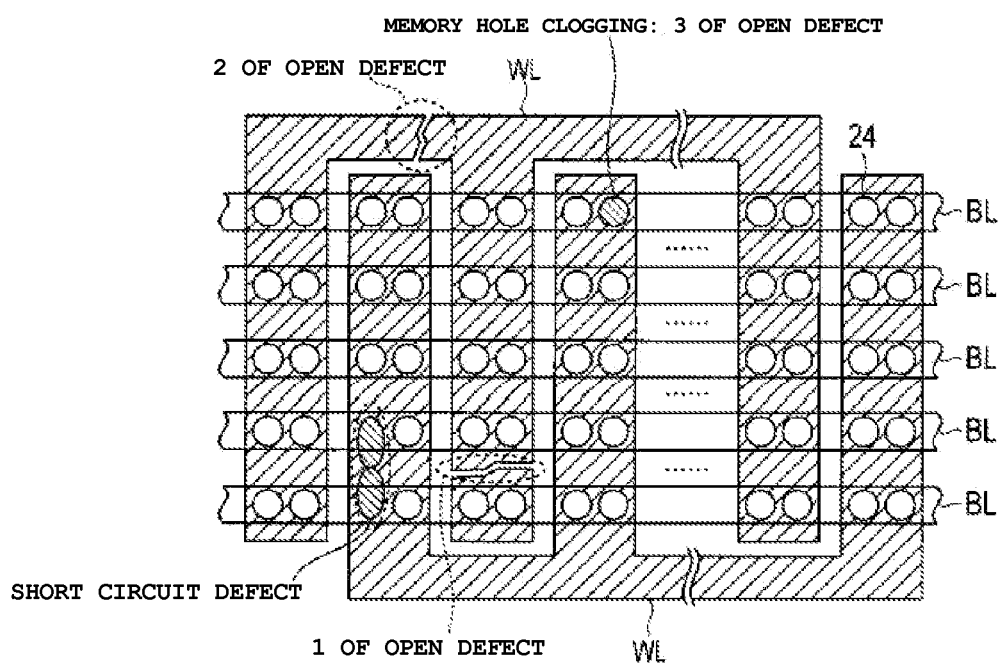
FIG. 42 is a plan view showing word lines.

In addition, in the second embodiment, the block test, the string test, and the page test have been explained by various detailed examples. However, defects such as block defect and string defect are not limited to those explained in the embodiment. FIG. 42 is a plan view showing a planar pattern of the word lines WL. As shown in the figure, the word lines WL have a comb shape, and two sets of word lines (in the example of FIG. 4, for example, WL0 and WL7, WL1 and WL6, WL2 and WL5, and WL3 and WL4) formed in the same layer are arranged in an alternate fashion.

In this constitution, in case two sets of word lines WL are short-circuited, its influence is affects all of the strings of the corresponding block BLK; in the short-circuit case, a defective position is difficult to specify. Therefore, in case short-circuit system defect occurs, it is desirable to register the entire block in a bad block. A short-circuit of the selective gate lines or a short circuit between the selective gate line and the word line is similar.

On the contrary, in the case of open-system defect, there is a possibility that this defect can be rescued at a string unit. For example, in case a disconnection occurs at the tip of a comb shape (1 of the open defect shown in FIG. 42), only the string including the disconnected part may be registered as a bad string. However, in case a disconnection occurs at the root part of the comb shape (2 of the open defect shown in FIG. 42), the rescue at a string unit might be difficult. In this case, the entire block is registered as a bad block. In addition, a defect due to clogging of the memory holes explained in the second embodiment (3 of the open defect shown in FIG. 42) can be rescued at a string unit.

Moreover, as shown in FIG. 42, short circuit defect between the adjacent memory holes can also be rescued at a string unit. In FIG. 42, the short circuit defect of the adjacent memory holes in the direction along the word lines WL is shown, and short circuit defect of the adjacent memory holes in the direction along the bit lines BL is similar.

Furthermore, even in case the rescue at a string unit is possible, if the number of bad strings that are included in one block is large, the bad strings may also be processed as a bad block. For example, the tester holds a reference value (for example, half of the number of strings in one block, and the like.) of the number of bad strings in advance and can register the number of bad strings as a bad block, if the number exceeds the reference number. This operation is similarly applied to the controller 200. After shipping the NAND-type flash memory 1, in case the number of bad strings increases and exceeds the reference value, the corresponding block may be registered as a bad block.

In addition, in the second embodiment, as explained with reference to FIG. 22 and FIG. 23, it is desirable to store bad block information in the ROM fuse and bad string information in the second ROM fuse different from the ROM fuse. The reason for this is that the bad string information is not information that must be read out in the POR. Moreover, if the bad string information is stored in the second ROM fuse, the size of the ROM fuse is suppressed from being increased, and the POR can be implemented at high speed. However, similar to the ROM fuse, the second ROM fuse is an area that is installed for only holding control information or management information of the NAND-type flash memory 1 and cannot be directly accessed by a user (host appliance). However, in case there is no problem in the size of the ROM fuse or the speed of the POR, the bad string information may be stored in the ROM fuse. In this case, at step S125 of FIG. 26, the bad string information is also transferred to the controller.

Furthermore, in the embodiments, a bad string sense is applied by the method explained in reference to FIG. 8 to FIG. 12. When data are written into the memory cell array 10, for example, the data are randomized by the CPU 230 of the controller 200. Its purpose is to prevent specific data from being concentrated on a specific column. For this reason, except for the case right after the erase of the data, the threshold level of all of the memory cell transistors MT can seldom be at the "C" level. Therefore, whether or not the bad string information is written into the selective transistors ST1 and ST2 or the back gate transistor BT can be decided by the method explained in reference to FIG. 8 to FIG. 12.

In addition, as previously explained, the pillars 26 and 30 in the memory holes are formed of intrinsic silicon. Therefore, the threshold of the selective transistors ST1 and ST2 or the back gate transistor BT is apt to be a negative value. For this reason, three-dimensional layered NAND-type flash memories have a mechanism for writing data (raising the threshold) into the selective transistors ST1 and ST2 or the back gate transistor BT as well as the memory cell transistors MT. Therefore, no special additional circuit is required to write the bad string information into the selective transistors ST1 and ST2 or the back gate transistor BT.

Moreover, as explained in FIG. 7, the threshold of the memory cell transistors MT and the back gate transistor BT is at the Er level right after electrons are pulled out of the charge storage layer and data are erased. In the three-dimensional NAND-type flash memory, the charge storage layer is connected between the adjacent memory cell transistors MT. Therefore, if the transistor with a negative threshold and the transistor with a positive threshold are adjacent, the data are likely to be broken by recoupling of the electric charges. Therefore, right after erasing, it is desirable to carry out a write operation for raising the threshold from the Er level to the EP level or to carry out a similar write operation at the reception timing of a write instruction of data from the controller. Therefore, step S147 of FIG. 29 may be an erase operation for only raising the threshold to the Er level, or it may also include a write operation from the Er level to the EP level as well as this erasing operation. The verify level that is utilized at step S148 depends upon the adoption of these operations. These operations, for example, are similarly applied to step S191 of FIG. 34 or FIG. 36.

Furthermore, in the sixth embodiment, the method for deciding whether or not a defect is controlled at a string unit has been explained by several detailed examples. However, it is not limited to the method explained in the sixth embodiment, as other methods may also be employed. For example, in the erase verify, the confirmation of whether or not a read operation is carried out at a string unit as explained in FIG. 29 can also be one decision method.

In addition, in the embodiments, the case where data are erased at a block unit has been explained as an example. However, the erase at a string unit is also possible. In this case, in nonselective strings, the potential of the selective gate lines SGD and SGS, the source line SL, and the bit lines BL may be low to the degree that no GIDL occurs. Moreover, in the write, read, and erase of data, the values used in the previous explanation are only examples and can be appropriately changed. Furthermore, in the embodiments, the case where each memory cell transistor MT holds 2-bit data has been described as an example; however, the case where 1-bit data are held or the case where data of 3 bits or more are held may also be adopted.

Figure 43:
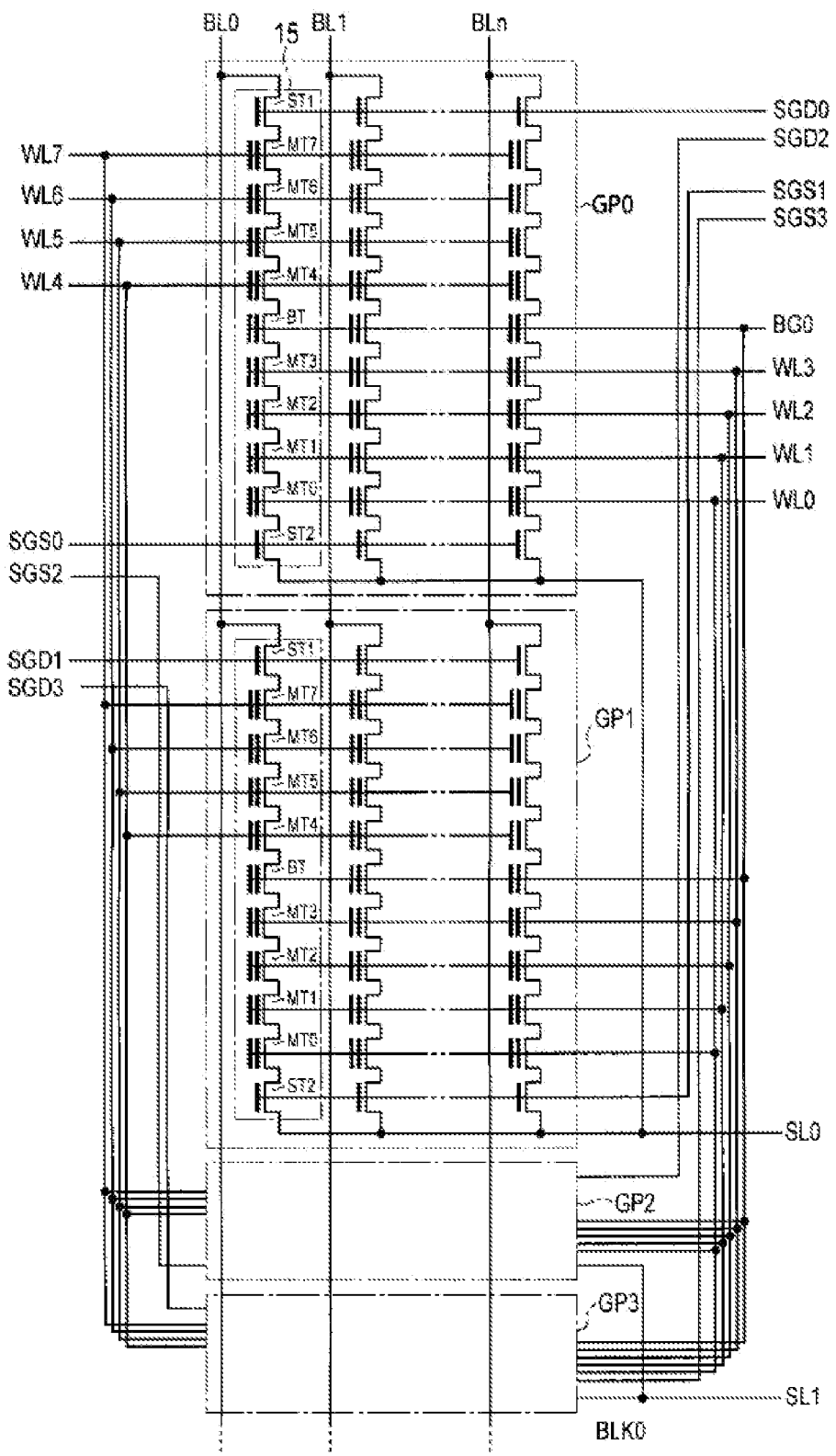
FIG. 43 is a circuit diagram showing a memory cell array of a modified example of the first to the seventh embodiments.

In addition, the memory cell array shown in FIG. 2 may have a constitution as shown in FIG. 43. FIG. 43 is a circuit diagram showing the block BLK0 and corresponds to the use of the word line pattern as shown in FIG. 42 in FIG. 2. The other blocks BLK1 to BLK3 can have a similar constitution. As shown in the figure, the word lines WL0 to WL3, the back gate line BG, the even number of selective gate lines SGD0 and SGD2, and the odd number of selective gate lines SGS1 and SGS3 are led out to one end of the memory cell array 10. On the contrary, the word lines WL4 to WL7, the even number of selective gate lines SGS0 and SGS2, and the odd number of selective gate lines SGD1 and SGD3 are led out to the other end of the memory cell array opposite to the one end. This constitution may be adopted. In this constitution, for example, the row decoder 11 may be divided into two row decoders and arranged opposite to each other via the memory cell array 10. Moreover, the selective gate lines SGD0, SGD2, SGS1, and SGS3, the word lines WL0 to WL3, and the back gate line BG may be selected by one row decoder, and the selective gate lines SGS0, SGS2, SGD1, and SGD3 and the word lines WL4 to WL7 may be selected by the other row decoder. According to this constitution, the congestion of wirings such as selective gate lines and word lines of an area (including the row decoder 11) between the first driver 16 and the memory cell array 10 can be relaxed.

Furthermore, in the embodiments, as the semiconductor memory device, the three-dimensional layered NAND-type flash memory has been explained as an example. However, the three-dimensional layered NAND-type flash memory is not limited to the constitutions of FIG. 3 to FIG. 5. For example, the semiconductor layer 26 may be one columnar shape instead of the U shape. In this case, the transistor BT is not required. In addition, the embodiments are limited to the NAND-type flash memory but can be applied to a general constitution in which memory cells are three-dimensionally layered and the memory cells have a selective gate.

Furthermore, the embodiments are not limited to the constitution in which the memory cells are three-dimensionally layered. For example, an ordinary planar NAND-type flash memory in which memory cell transistors and selective transistors are two-dimensionally arranged on a semiconductor substrate can also implement the embodiments. In this case, the structure of the selective transistors is also the same as that of the memory cell transistors, thus making it possible to write defect information into the selective transistors. However, in the planar NAND-type flash memory, one string group in the layered NAND-type flash memory corresponds to one block. Therefore, the information that is written into the selective transistors in the planar NAND-type flash memory is bad block information.

Here, unlike the three-dimensional layered type, in the planar NAND-type flash memory, data are erased by applying a voltage to a well area, and the selective transistors are also erased. However, in the planar NAND-type flash memory, since a measurement of the threshold of the selective transistors from being changed is usually taken, no special circuit addition is required, and information in the selective transistors can be prevented from being erased.

Moreover, in the planar NAND-type flash memory, it is also necessary to install the latch circuit 82 for holding the bad block flag BBF in the row decoder because of short circuit system defect. On the other hand, as for open system defect, it is unnecessary to write its information into the fuse ROM, contributing to the high speed of the POR and the saving of the ROM.

More specifically, in the short-circuit defect of word lines, it is difficult to discriminate specific short-circuit positions. Therefore, to prevent a high voltage from being applied to intended positions, a bad block registration is made at the row decoder, so that the voltage is prohibited from being applied to a bad block. Specifically, a latch is installed in the row decoder, and the bad block flag BBF is written into the latch. The controller then reads the BBF by the POR. Therefore, a fuse ROM for writing the bad block information is required for the short-circuit defect.

In the open system defect, even if the row decoder outputs a voltage, the voltage is not applied to the position where the open defect occurs (or even if the voltage is applied, the voltage is not sufficiently applied). In other words, when data are written, the data cannot be written, or even if the data can be written, since the reliability is low, a bad block is formed. However, unlike the short-circuit defect, since the voltage is not applied to unintended positions, if the method (the method that manages defect at a string group unit and writes its information into a selective transistor) explained in the embodiments is employed, the BBF is not particularly required to be set in the row decoder. Therefore, the area of the fuse ROM for this purpose is also unnecessary.

Furthermore, the sequence of the flow charts explained in the embodiments can also be switched, if necessary.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Structure of the memory cell array 10 is not limited as described above. The memory cell array may have the structure disclosed in U.S. patent application Ser. No. 12/532,030, the entire contents of which are incorporated by reference herein.

What is claimed is:

1. A semiconductor memory device, comprising a memory string that includes:
   a plurality of memory cell transistors connected in series; and
   a first transistor having a charge storage layer and a control gate and connected in series with the memory cell transistors,
   wherein a charge is stored in the charge storage layer of the first transistor to indicate that the memory string is defective.

2. The semiconductor memory device according to claim 1, wherein a threshold voltage of the first transistor is increased to be greater than a standard read/write voltage to indicate that the memory string is defective.

3. The semiconductor memory device according to claim 1, wherein the first transistor does not hold data but functions as a current path when data are written, read out, and erased to or from the memory cell transistors.

4. The semiconductor memory device according to claim 1, further comprising:
   first and second selective transistors, each including a charge storage layer and a control gate;
   wherein the first and second selective transistors are defective and a charge is stored in the charge storage layer of the first transistor to indicate that the memory string is defective.

5. The semiconductor memory device according to claim 4, wherein the first transistor is connected in series between a first group of the memory cell transistors and a second group of the memory cell transistors.

6. The semiconductor memory device according to claim 1, further comprising:
erasable memory blocks,
wherein one of the memory blocks includes, in addition to the memory string, other memory strings.

7. A memory system comprising:
a non-volatile semiconductor memory including erasable blocks, each of the erasable blocks including a plurality of memory strings; and
a memory controller configured to issue read, write, and erase instructions to the non-volatile semiconductor memory in response to commands from a host,
wherein each of the memory strings includes a plurality of memory cell transistors connected in series, and a first transistor having a charge storage layer and a control gate and connected in series with the memory cell transistors, and
wherein a charge is stored in the charge storage layer of the first transistor to indicate that the memory string is defective.

8. The memory system according to claim 7, wherein a threshold voltage of the first transistor is increased to be greater than a standard read/write voltage to indicate that the memory string is defective.

9. The memory system according to claim 7, wherein the first transistor does not hold data but functions as a current path when data are written, read out, and erased to or from the memory cell transistors.

10. The memory system according to claim 7, wherein each of the memory strings includes first and second selective transistors, each including a charge storage layer and a control gate;
wherein the first and second selective transistors are defective and a charge is stored in the charge storage layer of the first transistor to indicate that the memory string is defective.

11. The memory system according to claim 10, wherein the first transistor is connected in series between a first group of the memory cell transistors and a second group of the memory cell transistors.

12. The memory system according to claim 7, further comprising:
erasable memory blocks,
wherein one of the memory blocks includes, in addition to the memory string, other memory strings.

* * * * *